(12) United States Patent
Hoyos et al.

(10) Patent No.: US 7,253,761 B1
(45) Date of Patent: Aug. 7, 2007

(54) ANALOG TO DIGITAL CONVERSION WITH SIGNAL EXPANSION

(75) Inventors: Sebastian Hoyos, Berkeley, CA (US); Brian M Sadler, Laurel, MD (US); Gonzalo R. Arce, Newark, DE (US)

(73) Assignee: United States of America as Represented by the Secretary of the Army, Washington, DC (US)

( * ) Notice: Subject to any disclaimer, the term of this patent is extended or adjusted under 35 U.S.C. 154(b) by 0 days.

(21) Appl. No.: 11/268,532

(22) Filed: Nov. 8, 2005

Related U.S. Application Data

(60) Provisional application No. 60/630,762, filed on Nov. 8, 2004.

(51) Int. Cl.
  *H03M 1/12* (2006.01)
(52) U.S. Cl. ...................................... 341/155; 341/143
(58) Field of Classification Search ................. 341/155
  See application file for complete search history.

(56) References Cited

U.S. PATENT DOCUMENTS

| | | | | |
|---|---|---|---|---|
| 5,568,142 A | * | 10/1996 | Velazquez et al. | 341/126 |
| 6,177,893 B1 | * | 1/2001 | Velazquez et al. | 341/118 |
| 6,252,535 B1 | * | 6/2001 | Kober et al. | 341/155 |
| 6,476,749 B1 | * | 11/2002 | Yeap et al. | 341/155 |
| 6,518,908 B2 | * | 2/2003 | Boehm et al. | 341/155 |

* cited by examiner

*Primary Examiner*—Khai M. Nguyen
(74) *Attorney, Agent, or Firm*—William V. Adams

(57) ABSTRACT

Included are embodiments of a method for converting a received analog signal into a digital signal. Some embodiments of the method can include receiving an analog signal; periodically dividing the received analog signal into a plurality of discrete signals at a predetermined interval, wherein each of the plurality of divided signals is associated with a voltage; and quantizing the voltage associated with at least one of the plurality of divided signals. Other systems and methods are also provided.

20 Claims, 18 Drawing Sheets

ANALOG TO DIGITAL CONVERSION WITH SIGNAL EXPANSION

CROSS REFERENCE

This application claims the benefit of U.S. Provisional Application No. 60/630,762 filed Nov. 8, 2004, which is hereby incorporated by reference in its entirety.

BACKGROUND

Digital wideband (WB) systems (including ultra-wideband—UWB—systems) are highly desirable, offering flexibility and programmability. However, while system data rates and bandwidths continue to expand, analog-to-digital converters (ADCs) are limited in bandwidth, resolution, and power consumption. Currently available architectures used in the fabrication of ADCs include flash architecture, which is based on parallel techniques that use $2^b-1$ comparators to achieve "b" bits of resolution. While comparators can sample analog input signals simultaneously, this can increase the speed of the flash ADC. Because of the parallelism of this architecture, the number of comparators can grow exponentially with b, thus increasing the power consumption and also the circuitry area. This can facilitate an increase in the input capacitance limiting the system bandwidth, thereby increasing the difficulty to match components.

Some variations of flash architecture such as the folded-flash, pipelined and time interleaved architectures have been proposed in order to overcome some of these problems. However these techniques are also not without difficulties that have slowed the evolution of ADCs such as aperture jitter or aperture uncertainty, which is the sample-to-sample variation of the instant in time at which sampling occurs. Moreover, the speed of sampling can be limited by the frequency characteristic of the device used in the design, which can limit the ability of the comparators to make an unambiguous decision about the input voltage.

To overcome these problems, techniques that aim to relax the operational conditions of the ADC have been proposed. Low-resolution ADC is possible with sigma-delta modulation. The noise penalty associated with the use of a few bits or less in the quantization process is overcome in the sigma-delta scheme by using either signal oversampling or multi-band processing techniques. In particular, when a single bit is used, the implementation is greatly simplified and practical mono-bit WB (or UWB) digital communications receivers have significant potential. These techniques generally utilize sampling at or above the Nyquist rate over the full signal bandwidth, and can therefore suffer from the aforementioned high-speed issues. In addition, they provide a single WB (or UWB) serial data stream, which may stress the digital signal processing following the ADC.

An alternative is to channelize the analog signal by means of a bank of bandpass filters, and the output of each filter are sampled in parallel. Multi-rate approaches can also be used. ADC thus can occur at a reduced rate for each of the resultant bandpass signals. The bandpass outputs can also be frequency translated to baseband, allowing the use of a single lowpass filter design. However, the bandpass analog filter bank design is difficult, and the resulting non-ideal filters cause signal leakage across the bands that can degrade overall system performance unless properly accounted for. The design of analog filters with sharp roll-off needed in the multi-band ADC approaches also suffers from power consumption and large circuitry area to accommodate the passive elements (i.e., inductors and capacitors). Additionally, implementation of the bank of bandpass filters in the multi-band processing ideas can be potentially troublesome; problems such as spectrum sharing due to the non-ideal characteristics of the bandpass filters can affect the overall system performance.

High-speed signal processing utilized in analog to digital (A/D) conversion of wideband signals (and ultra-wideband signals) imposes challenging implementation problems, and sometimes impractical power consumption. Current time-domain A/D conversion encounters technological barriers as time-domain signal features shrink to very fine resolution, on the order of tenths, and sometimes hundredths of nanoseconds. In order to overcome these problems, techniques that aim to relax the speed of the A/D conversion have been proposed. In general, these techniques perform multi-band signal processing in which the spectrum of the signal is channelized into several bands by means of a bank of bandpass filters. A/D conversion thus occurs at a much reduced speed for each one of the resultant bandpass signals.

Further, a bank of frequency modulators can be used to shift the signal spectrum so that the center frequency of each sub-band tends toward zero frequency, allowing the use of a bank of identical low-pass filters. Sigma-delta modulation has also been proposed since it enables A/D conversion with low-resolution. The noise penalty associated with the use of few bits in the quantization process is overcome in the sigma-delta scheme by using either signal oversampling or multi-band processing techniques. In particular, when a single bit is used, the implementation is greatly simplified and practical mono-bit digital receivers can be implemented. Since all these techniques are based on time-domain A/D conversion, they suffer from high-speed limitations, making it desirable to channelize the signal spectrum into several sub-bands.

Thus, a heretofore-unaddressed need exists in the industry to address the aforementioned deficiencies and inadequacies.

SUMMARY

Included in this disclosure are methods for converting analog signals to digital signals. At least one embodiment of the method, among others includes receiving an analog signal; periodically dividing the received analog signal into a plurality of discrete signals at a predetermined interval, wherein each of the plurality of divided signals is associated with a voltage; and quantizing the voltage associated with at least one of the plurality of divided signals.

Additionally included herein are embodiments of an analog to digital converter. At least one embodiment of an analog to digital converter includes at least one receiving component configured to receiving an analog signal; at least one dividing component configured to divide the received analog signal into a plurality of discrete signals at a predetermined interval, wherein each of the plurality of divided signals is associated with a voltage; and at least one quantizer configured to quantize at least one voltage associated with the at least one of the plurality of divided signals.

Also included within this disclosure are embodiments of a computer readable medium. At least one embodiment of a computer readable medium includes logic configured to receive an analog signal; logic configured to periodically divide the received analog signal into a plurality of discrete signals at a predetermined interval, wherein each of the plurality of divided signals is associated with a voltage; and logic configured to quantize at least one voltage associated with the at least one of the plurality of divided signals.

Other systems, methods, features, and advantages of this disclosure will be or become apparent to one with skill in the art upon examination of the following drawings and detailed description. It is intended that all such additional systems, methods, features, and advantages be included within this description and be within the scope of the present disclosure.

BRIEF DESCRIPTION

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, there is no intent to limit the disclosure to the embodiment or embodiments disclosed herein. On the contrary, the intent is to cover all alternatives, modifications, and equivalents.

DETAILED DESCRIPTION

Figure 1:
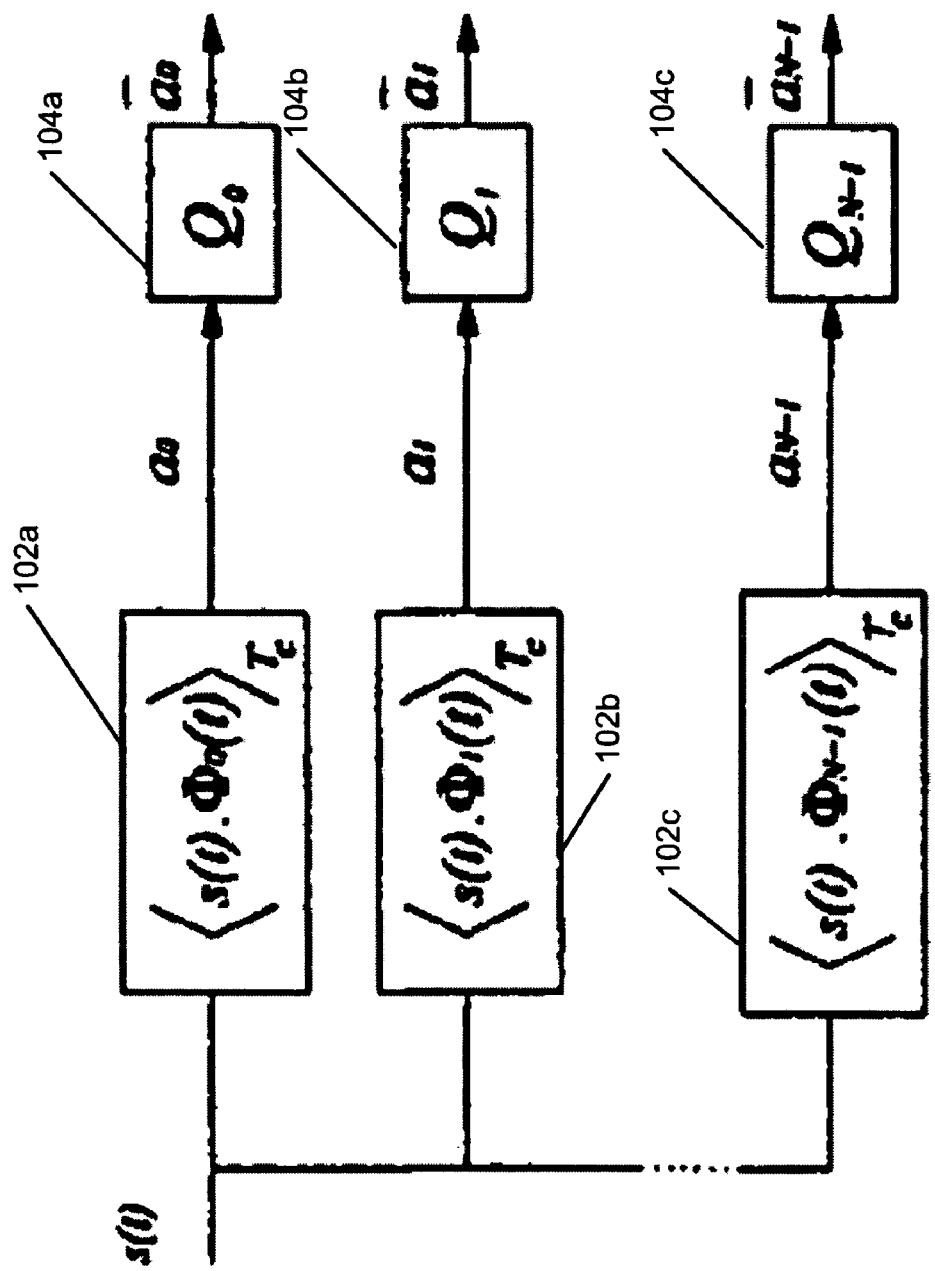
FIG. 1 is an exemplary block diagram of an analog to digital converter for expanding a received signal using a set of orthogonal basis functions.

Included herein are techniques to perform analog to digital (A/D) conversion, based on the quantization of coefficients obtained by the projection of a continuous time signal over an orthogonal space. The new A/D techniques proposed herein are motivated by the sampling of an input signal in domains which may lead to lower levels of signal distortion and significantly less demanding A/D conversion characteristics. As a nonlimiting example, much of the A/D conversion is studied in the frequency domain, where samples of the signal spectrum are taken such that no time aliasing occurs in the discrete time version of the signal. One can show that a frequency domain analog to digital converter (ADC) overcomes some of the difficulties encountered in conventional time-domain methods for A/D conversion of signals with large bandwidths (such as wideband) and very large bandwidths, such as ultra-wideband (UWB) signals. The discrete frequency samples can then be passed through a vector quantizer with relaxed characteristics, operating over DC level that can change with a speed that is much lower than that required for time domain A/D conversion. Fundamental points of merit in A/D conversion and important system trade-offs are discussed for the proposed frequency domain ADC. As a nonlimiting example, at least one embodiment considers a multi-carrier UWB communications scheme.

Also included herein are approaches to analog to digital conversion that can overcome limitations encountered in the implementation of time-domain A/D converters. These approaches can exploit signal representation in domains other than the classical time domain, which can reduce the speed of comparators that make quantization of the sampled signal, and potentially improve the distortion versus average bit rate of the A/D conversion. As a nonlimiting example, at least one embodiment discussed herein considers a frequency domain ADC in which samples of the signal spectrum are taken at a rate that guarantees no aliasing in the discrete-time signal domain. As discussed in more detail below, the consequences of carrying out the A/D conversion in new domains are discussed, and fundamental figures of merit in analog to digital conversion are analyzed.

One approach is to project the received signal over basis functions, and then sample the basis coefficients. Representing the signal in a domain other than the classical time-domain sampling approach yields parallel data streams, and potentially improves the distortion versus average bit rate in the sampled output. The time-domain signal may be reconstructed via a linear digital computation, or signal processing can be carried out directly with the basis coefficients.

"N" basis coefficients can be calculated in a parallel analog computation every $T_c$ seconds, followed by N parallel ADCs. Thus, the ADCs can run at a speed that is inversely proportional to the time-window duration $T_c$, which can be properly designed to meet the speeds allowed by the technology used in the implementation. The speed reduction comes at the cost of the implementation of the local basis function generators, mixers and integrators needed to project the continuous-time signal onto the set of basis functions. This introduces a trade-off between sampling speed reduction and system complexity that is characterized in this disclosure. Although similar reductions in the speed of the quantizers could be achieved in the time domain by using a time-interleaved bank of quantizers, synchronization problems, the very fine time resolution in high-speed applications, and the fact that all the ADCs see the full bandwidth of the input signal makes it difficult to design the sample/hold circuitry and causes the overall design to require significant power. In addition, the signal expansion approach avoids the sharp rolloff filter bank needed in multi-band ADC architectures. Mixing with basis functions, followed by integration over a time window required to project the signal, generally synthesizes a filter bank with overlapping spectrum and smooth transitions. The relaxed implementation requirements are a motivation (among others) for the ideas discussed herein.

Potential lower bit requirements and/or the potential improvement in the distortion of the ADC of signal expansions, can be achieved by optimally allocating the available number of bits in the quantization of the coefficients obtained through the projection of the continuous-time signal over the basis set. The possibility of efficiently allocating the available resources in terms of number of bits per sample is a feature that is not available in conventional time-domain ADC. Optimal bit allocation is possible in the proposed A/D conversion scheme because some signal characteristics that are hidden in the time-domain, such as power spectral distribution, can now be explored by projecting the continuous-time signal.

As a nonlimiting example, one can consider A/D conversion in the frequency domain, in which samples of the signal transform are taken at a rate that guarantees no aliasing in the discrete-time signal domain. The discrete frequency samples are then quantized by a set of quantizers operating over DC levels that change with a rate that is much lower than the Nyquist rate needed in the sampling of the time domain signal. Other domains, such as those provided by the Hadamard, Walsh, Walsh-Fourier and Haar wavelet transforms, are also potential candidates.

Perhaps, the closest related publication is sampling of signal projections, and some information theory work on over complete expansions, where quantization of the coefficients of redundant expansions is carried out. These publications study improved sampling techniques based mainly on vector quantization, oversampling, and signal reconstruction algorithms.

FIG. 1 is an exemplary block diagram of an analog to digital converter for expanding a received signal using a set of orthogonal basis functions. More specifically, the block diagram depicted in FIG. 1 shows a basic orthogonal expansion principle of a proposed A/D conversion. The received signal s(t) is decomposed every $T_c$ seconds into N components, which are obtained through the projection over a set of orthogonal bases 102a, 102b, and 102c

$$\Phi_l(t)|_{l=0}^{N-1}.$$

The coefficients $$a_l|_{l=0}^{N-1}$$

are found as:

$$a_l = \langle s(t), \Phi_l(t) \rangle_{T_c} = \int_0^{T_c} s(t)\Phi_l^*(t)\,dt, \qquad (A1)$$

where the mean square error criterion is used to approximate the received signal s(t) in a $T_c$ second interval as follows $$\hat{s}(t) = \sum_{l=0}^{N-1} a_l \Phi_l(t). \qquad (A2)$$

At the end of the conversion time $T_c$, the coefficient $$a_l|_{l=0}^{N-1}$$

reach a constant value that is sent to a set of quantizers $$Q_l(x)|_{l=0}^{N-1}$$

104a, 104b, and 104c, which return the digital words $$\bar{a}_l|_{l=0}^{N-1}.$$

These digital values represent the output of this analog to digital converter for the input signal in a $T_c$ second interval. When a limited number of coefficients are used in the A/D signal conversion, some distortion can be introduced. This distortion plus the distortion introduced by the quantization process constitute the overall distortion of the proposed A/D conversion, which is analyzed in more detail below.

The distortion introduced by the A/D converter in orthogonal spaces is generated by the potential limited number of coefficients N, and by the finite number of bits used in the quantization of the coefficients $$a_l|_{l=0}^{N-1}.$$

The first distortion introduces an error (e(n)=s(t)−ŝ(t)) in the reconstruction formula (A2), where the coefficients $$a_l|_{l=0}^{N-1}$$

are calculated as in (A1) in order to minimize the MSE distortion. The distortion obtained with N coefficients can be expressed as $$D_{\phi,N} = E_{s,T_0} - \sum_{l=0}^{N-1} \sigma_l^2, \quad (A3)$$

where $E_{s,T_c}$ is the energy of the signal in the conversion interval $T_c$ $$\sigma_l^2$$

is the variance of the coefficient $a_l$, and the distortion $D_{\Phi,N}$ is nonnegative by definition. When the distortion reaches the zero value for a number of coefficients $N^*$, then $s(t)=\hat{s}(t)$, where the equality holds in the sense that the approximation error has zero energy.

The distortion introduced by the finite number of bits used in the quantization of the orthogonal domain coefficients will be denoted as $D_{\Phi,Q}$ that is commonly quantified by the average mean square error (MSE). One can define $$A_l \mid_{l=0}^{N-1}$$

and $$\overline{A}_l \mid_{l=0}^{N-1}$$

as the random variables associated to the coefficients $$a_l \mid_{l=0}^{N-1}$$

and $$\overline{a}_l \mid_{l=0}^{N-1}$$

respectively. Thus the MSE of the quantization error is $$D_{\phi,Q} = \frac{1}{N} E\{\|A - \overline{A}\|^2\} = \frac{1}{N} \sum_{l=0}^{N-1} D_{\phi l,Q} \quad (A4)$$

where $$D_{\phi,Q} = E\{(A - \overline{A})^2\} = \epsilon_{\phi_l}^2 \sigma_{\phi_l}^2 2^{-2R_l}$$

for a sufficiently high bit rate $R_l$, where $$\epsilon_{\phi_l}^2$$

is a constant that depends on the probability density function (pdf) of $a_l$, namely $p(a)$. Therefore the average distortion introduced by the quantization process is $$D_{\phi,Q} = \frac{1}{N} \sum_{l=0}^{N-1} \epsilon_{\phi_l}^2 \sigma_{\phi_l}^2 2^{-2R_l} \quad (A5)$$

At this point, one may desire to find the optimal bit allocation among the N coefficients, i.e. it is desirable to find the set of rates $$R_l \mid_{l=0}^{N-1}.$$

constrained $$\sum_{l=0}^{N-1} R_l = RN$$

such that the distortion in (A5) is minimized. This classical optimization problem can be solved using Lagrange multipliers, leading to the following result $$R_l = R + \frac{1}{2} \log_2 \left( \frac{\epsilon_{\phi_l}^2 \sigma_{\phi_l}^2}{\prod_{l=0}^{N-1} \epsilon_{\phi_l}^2 \sigma_{\phi_l}^2} \right). \quad (A6)$$

The optimum solution assigns more bits to the coefficients with larger variance such that the distortion of all the coefficients is uniform and equal to $$D_{\Phi_l,Q} = D_{\Phi,Q} = \left( \sum_{l=0}^{N-1} \epsilon_{\phi_l}^2 \sigma_{\phi_l}^2 \right)^{1/N} 2^{-2R}. \quad (A7)$$

This bit allocation resembles the concept of reverse water filling found in rate distortion theory. One should note that if the variance of one coefficient is sufficiently small, the result rate from Equation (A6) could be negative, which in practice would mean that the coefficient can be discarded. It is interesting to compare the performance of the newly defined A/D conversion with the conventional pulse coding modulation (PCM) technique in which each time-domain sample is quantized with the same number of bits R. The distortion incurred by PCM is $$D_{PCM} = \epsilon_t^2 \sigma_t^2 2^{-2R}$$

where the sub-index t stands for time, $\epsilon_t$ depends on the pdf of any sample of the time-domain signal, which is assumed stationary, and $$\sigma_t^2$$

is the sample's variance. Now, one can define a very important figure of merit of the proposed A/D conversion in orthogonal spaces, the orthogonal space A/D conversion gain ($G_{OSADC}$). This nonlimiting example compares the performance of the proposed A/D method with the performance of a conventional A/D with PCM, which is defined as $$G_{OSADC} = \frac{D_{PCM}}{D_{\phi,Q} + D_{\phi,N}}. \quad (A8)$$

which is the ratio between the distortion of PCM and the distortion introduced by both the limited number of coefficients and the quantization error when carrying out the A/D conversion in orthogonal spaces. After substitution, the equation becomes $$G_{OSADC} = \frac{\epsilon_t^2 \sigma_t^2 2^{-2R}}{\left(\Pi_{l=0}^{N-1} \epsilon_{\Phi_l}^2 \sigma_{\Phi_l}^2\right)^{1/N} 2^{-2R} + E_s T_0 - \sum_{l=0}^{N-1} \sigma_{\Phi_l}^2} \quad (A9)$$

It is interesting to analyze the special case in which the number of coefficients reaches the defined value N*, which makes zero the distortion pointed out in (A3). In that case, (A9) can be expressed as:

$$G_{OSADC} = \frac{\epsilon_t^2 \frac{1}{N} \sum_{l=0}^{N-1} \sigma_{\Phi_l}^2}{\left(\prod_{l=0}^{N-1} \epsilon_{\Phi_l}^2\right)^{1/N} \left(\prod_{l=0}^{N-1} \sigma_{\Phi_l}^2\right)^{1/N}} \quad (A10)$$

where the last equality follows from the fact that the average energy of the coefficients $$a_l \big|_{l=0}^{N^*-1}$$

equals the time sample's variance since the error e(n) has zero energy. Equation (A10) shows the potential gain of the proposed method as the $G_{OSADC}$ is proportional to the ratio of the arithmetic mean of the orthogonal coefficients variances to the geometric mean of the same variances. Since the arithmetic mean is larger than or equal to the geometric mean, being equal only when all the variances are the same, and in general $$\epsilon_t^2 \leq \left(\prod_{l=0}^{N-1} \epsilon_{\Phi_l}^2\right)^{1/N}$$

where $G_{OSADC} \geq 1$ or $D_{PCM} \geq D_{\Phi,Q}$ under the same average bit rate. Notice that a more uneven distribution of the variances leads to a larger gain, which can be advantageous in domains where the variance distribution is known or can be predicted.

The nature of this ADC leads to carrying out digital signal processing (DSP) applications in the same domain used in the A/D conversion itself. A classical example of this duality is the time-frequency pair, which is hereafter studied in the context of A/D conversion.

Figure 2:
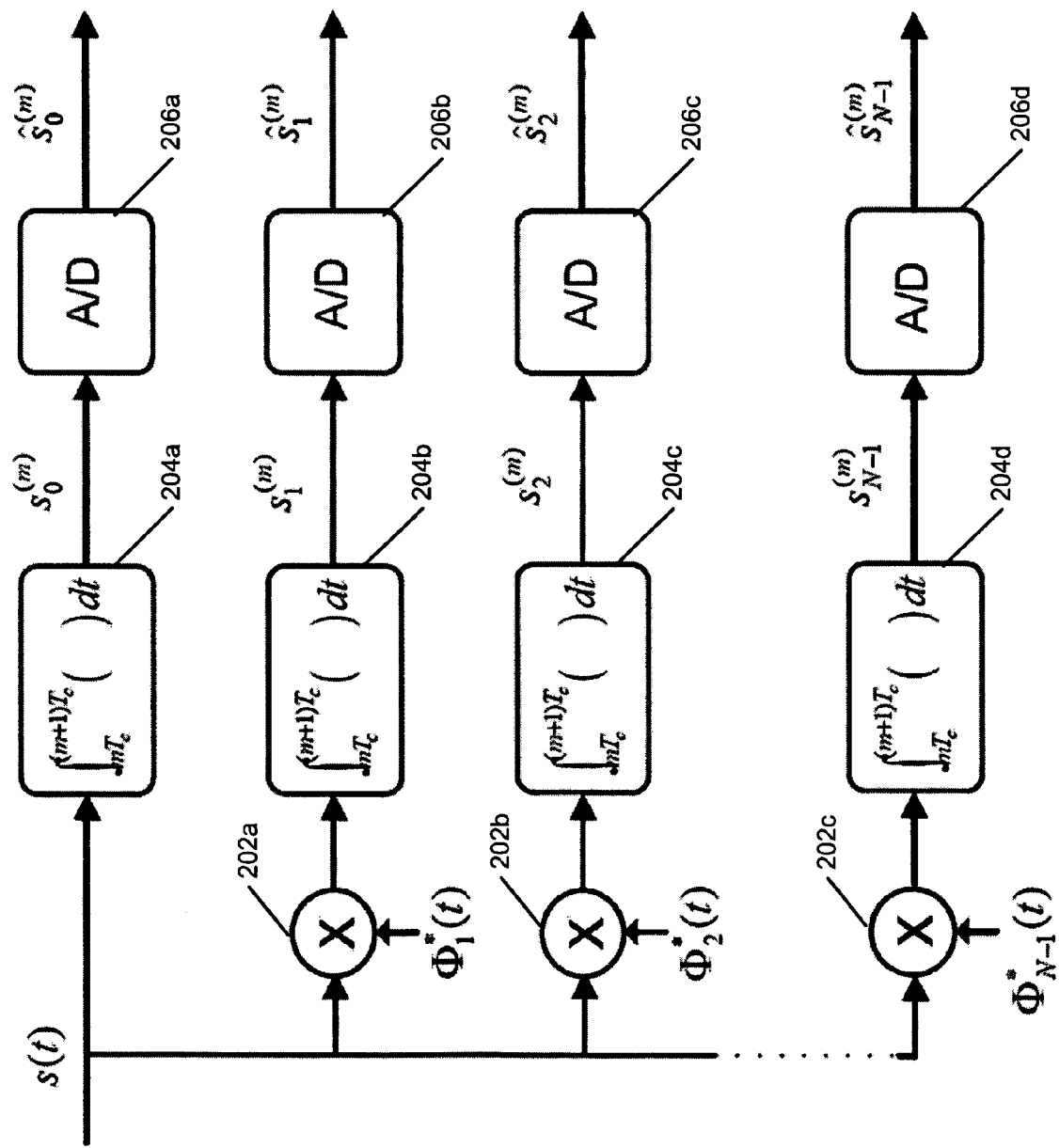
FIG. 2 is an exemplary block diagram of an analog to digital converter that is configured to expand a received signal using a set of basis functions, similar to the block diagram from FIG. 1.

FIG. 2 is an exemplary block diagram of an analog to digital converter that is configured to expand a received signal using a set of basis functions, similar to the block diagram from FIG. 1. More specifically, FIG. 2 illustrates a basic signal expansion principle of a proposed A/D conversion. A received signal s(t) is decomposed every $T_c$ seconds into N components, which are obtained through the projection over the basis $$\Phi_l(t) \big|_{l=0}^{N-1}$$

202a, 202b, and 202c. The coefficients $$s_l^{(m)} \big|_{l=0}^{N-1}$$

are found as $$s_l^{(m)} = \langle s(t), \Phi_l(t) \rangle_{m,T_c} = \int_0^{T_c} s(t + mT_c) \Phi_l^*(t) \, dt. \quad (A11)$$

as illustrated with reference elements 204a, 204b, 204c, and 204d.

If the mean square error (MSE) criterion is used to reconstruct the received signal s(t) in the interval $mT_c \leq t \leq (m+1)T_c$ through a linear combination of the basis functions $$\Phi_l(t) \big|_{l=0}^{N-1},$$

in general the coefficients $$s_l^{(m)} \big|_{l=0}^{N-1}$$

can be linearly transformed. One can define the N×N matrix Ψ, which contains the correlation coefficients of the basis functions, $$\psi_{n,l} = \langle \Phi_n(t), \Phi_l(t) \rangle_{T_c} = \int_0^{T_c} \Phi_n^*(t) \Phi_l^*(t) \, dt, \; n, l = 0, \ldots, N. \quad (A12)$$

The coefficients $a_l^{(m)}$ that provide an MSE approximation, can be found by solving the linear equation $$s^{(m)} = \Psi a^{(m)} \quad (A13)$$

where the vectors $s^{(m)}$ and $a^{(m)}$ are defined as $s^{(m)} = [s_0^{(m)} \ldots s_{N-1}^{(m)}]^T$ and $a^{(m)} = [a_0^{(m)} \ldots a_{N-1}^{(m)}]^T$. Solving Equation (A13) requires invertibility of the matrix Ψ. If the basis functions are orthonormal, then $a^{(m)} = s_{(m)}$. An MSE approximation can be given by $$\bar{s}^{(m)}(t) = \sum_{i=0}^{N-1} a_i^{(m)} \Phi_i(t), \quad 0 \leq t \leq T_c, \quad (A14)$$

where the signal $\bar{s}^{(m)}(t)$, $0 \leq t \leq T_c$, is an MSE approximation of the input signal s(t), $mT_c \leq t \leq (m+1)T_c$. At the end of the conversion time $T_c$, the coefficients $$s_l^{(m)} \big|_{i=0}^{N-1}$$

reach a constant value that is sent to a set of quantizers $$Q_i^{(m)} \big|_{i=0}^{N-1}$$

206a, 206b, 206c, and 206d, one for each coefficient, which can return the digital words $$\hat{s}_i^{(m)} \big|_{i=0}^{N-1}.$$

The $l^{th}$ quantizer $Q_l^{(m)}$ has $2^{b_l}$ output levels, where $$b_i \big|_{i=0}^{N-1}$$

is the number of bits used to obtain the quantized set of coefficients $$\hat{s}_i^{(m)} \big|_{i=0}^{N-1}.$$

These values represent the output of the analog to digital converter for the input signal in a $T_c$ second interval. One should note that, in this nonlimiting example, the signal s(t) is being segmented by a rectangular window for simplicity, however windows with preferable characteristics can instead be used. The number of coefficients N used in the A/D conversion is intimately related to the conversion time $T_c$, and can affect the degree of the approximation indicated in Equation (A14), up to the point where the signal s(t) is represented with zero energy with a sufficient number of coefficients N*

$$\Phi_i(t) |_{i=0}^{N*-1}.$$

The existence of the number N* that makes the mean square error zero assumes that the basis functions $$\Phi_i(t) |_{i=0}^{N*-1}$$

span the input signal s(t). It is also possible that N* tends to infinity, as for example happens with signals with infinite spectral support (non-bandlimited signals) when they are projected in the frequency domain. However, for simplicity in the analysis, it is assumed that the input signal s(t) is a smooth, well behaved signal (in some embodiments a band-limited signal) that can be represented with a finite number of coefficients N*. The particular conditions that s(t) can satisfy for the existence of N* will depend on the domain chosen for the A/D conversion.

When only a limited number of coefficients (N≤N*) is used in the A/D signal conversion, some distortion is introduced. This distortion, plus the distortion introduced in the quantization process, can constitute major sources of distortion of the proposed A/D conversion, and is analyzed below. One can also consider timing and frequency offset distortion, discussed in more detail below.

Without loss of generality one can consider the interval $0 \leq t \leq T_c$, in which the coefficients $$\hat{a}_i |_{i=0}^{N-1}$$

at the output of the A/D converter provide a representation of the analog input signal in the conversion time Tc. The reconstructed signal is expressed as $$\hat{s}(t) = \sum_{i=0}^{N-1} \hat{a}_i \Phi_i(t), \quad 0 \leq t \leq T_c. \tag{A15}$$

Using the MSE criterion, the total distortion D can be expressed as $$D = E\{|s(t) - \hat{s}(t)|^2\} = E\{(s(t) - \hat{s}(t))(s(t) - \hat{s}(t))^*\} \tag{A16}$$

$$= E\left\{\left|\sum_{i=0}^{N*-1} a_i \Phi_i(t) - \sum_{i=0}^{N-1} \hat{a}_i \Phi_i(t)\right|^2\right\}$$

$$= E\left\{\left|\sum_{i=N}^{N*-1} a_i \Phi_i(t) + \sum_{i=0}^{N-1} a_i \Phi_i(t) - \sum_{i=0}^{N-1} \hat{a}_i \Phi_i(t)\right|^2\right\}$$

$$= E\left\{\left|\sum_{i=N}^{N*-1} a_i \Phi_i(t)\right|^2\right\} + E\left\{\left|\sum_{i=0}^{N-1} (a_i - \hat{a}_i)\Phi_i(t)\right|^2\right\} +$$

$$\sum_{i=N}^{N*-1}\sum_{k=0}^{N-1} E\{a_i^*(a_k - \hat{a}_k)\}\Phi_i^*(t)\Phi_k(t) +$$

$$\sum_{i=N}^{N*-1}\sum_{k=0}^{N-1} E\{a_i(a_k^* - \hat{a}_k^*)\}\Phi_i(t)\Phi_k^*(t).$$

In order to eliminate the time dependence in the distortion D, one can take the time average as follows:

$$\overline{D} = \frac{1}{T_c}\int_0^{T_c} E\{|s(t) - \hat{s}(t)|^2\} dt \tag{A17}$$

$$= \overline{E}\left\{\left|\sum_{i=N}^{N*-1} a_i \Phi_i(t)\right|^2\right\} + \overline{E}\left\{\left|\sum_{i=0}^{N-1} (a_i - \hat{a}_i)\Phi_i(t)\right|^2\right\} +$$

$$\sum_{i=N}^{N*-1}\sum_{k=0}^{N-1} E\{a_i^*(a_k - \hat{a}_k)\}\underbrace{\frac{1}{T_c}\int_0^{T_c} \Phi_i^*(t)\Phi_k(t) dt}_{=0} +$$

$$\sum_{i=N}^{N*-1}\sum_{k=0}^{N-1} E\{a_i(a_k^* - \hat{a}_k^*)\}\underbrace{\frac{1}{T_c}\int_0^{T_c} \Phi_i(t)\Phi_k^*(t) dt}_{=0}$$

$$= \overline{D}_N + \overline{D}_Q,$$

where the bar "¯" on top of any variable or operator indicates time average, for example $$\overline{E}\{\cdot\} = 1/T_c \int_0^{T_c} E\{\cdot\} dt.$$

Both terms in the third line of Equation (A17) are equal to zero due to the fact that the functions $$\Phi_i(t) |_{i=0}^{N*-1}$$

are orthogonal in the interval $0 \leq t \leq Tc$. Thus, the total distortion introduced by the A/D converter in orthogonal spaces is the sum of the truncation distortion due to the potentially limited number of coefficients N, which is denoted as $\overline{D}_N$, and the quantization distortion due to the finite number of bits used in the quantization of the coefficients $$a_i |_{i=0}^{N-1},$$

which is denoted as $\overline{D}_Q$. One can restrict the ADC distortion analysis presented in this analysis to signal projection over orthonormal basis functions for simplicity of the results. However, projection over linearly dependent basis functions can also be employed.

The first distortion $\overline{D}_N$ introduces truncation error in the reconstruction formula (4), which can be expressed as $$e(n) = s(t) - \overline{s}(t) = s(t) - \sum_{i=0}^{N-1} a_i \Phi_i(t), \tag{A18}$$

where the coefficients $$a_i |_{i=0}^{N-1}$$

are calculated as in Equation (A11) in order to minimize the MSE distortion, i.e., to minimize the energy of the error e(n). The distortion $\overline{D}_N$, obtained with N coefficients, can be expressed as $$\bar{D}_N = \bar{E}\left\{\left|\sum_{l=N}^{N_*-1} a_l \Phi_l(t)\right|^2\right\} = \frac{1}{T_c}\int_0^{T_c} E\left\{\left|\sum_{l=N}^{N_*-1} a_l \Phi_l(t)\right|^2\right\} dt \quad (A19)$$

$$= \frac{1}{T_c}\int_0^{T_c} E\left\{\sum_{l=N}^{N_*-1}\sum_{m=N}^{N_*-1} a_l a_m^* \Phi_l(t)\Phi_m^*(t)\right\} dt$$

$$= \sum_{l=N}^{N_*-1}\sum_{m=N}^{N_*-1} E\{a_l a_m^*\} \frac{1}{T_c}\int_0^{T_c} \Phi_l(t)\Phi_m^*(t) dt$$

$$= \frac{1}{T_c}\sum_{l=N}^{N_*-1} E\{a_l a_l^*\} = \frac{1}{T_c}\left(\sum_{l=0}^{N_*-1}\sigma_l^2 - \sum_{l=0}^{N-1}\sigma_l^2\right)$$

$$= \frac{1}{T_c}\left(E_{\sigma_1} T_c - \sum_{l=0}^{N-1}\sigma_l^2\right),$$

where $$E_{s,T_c} = \sum_{l=0}^{N_*-1}\sigma_l^2$$

is the energy of the signal in the conversion interval $T_c$, $\sigma_l^2$ is the variance of the coefficient $a_l$ (it is assumed $E\{a_l\}=0$ for convenience) and the distortion $\bar{D}_N$ is nonnegative by definition. The fourth line in Equation (A19) assumes that the functions $$\Phi_l(t)\big|_{l=0}^{N_*-1}$$

are orthonormal. When the number of coefficients is $N^*$, the distortion reaches the zero value and the received signal $s(t)$ can be represented as $$s(t) = \sum_{l=0}^{N_*-1} a_l \Phi_l(t), \quad 0 \le t \le T_c, \quad (A20)$$

where the quality holds in the sense that the approximation error has zero energy. From a theoretical point of view the truncation error $e(n)$ can be made as small as desired, however in a practical application this error may be non-zero as the number of coefficients $N$ can be limited by system constraints such as complexity and circuitry area. In this case, the coefficients with the largest variance $$\sigma_l^2$$

can be chosen in order to minimize the error energy in Equation (A19).

The distortion introduced by the finite number of bits used in the orthogonal-domain quantization of the coefficients, $\bar{D}_{Q^*}$, is called quantization error and is commonly measured by the average MSE, given $$\bar{D}_Q = \bar{E}\left\{\left|\sum_{l=0}^{N-1}(a_l - \hat{a}_l)\Phi_l(t)\right|^2\right\} = \frac{1}{T_c}\sum_{l=0}^{N-1} D_{Q_l}, \quad (A21)$$

where the same argument used in Equation (A19) is used here to simplify the expression, and $D_{Q_l}=E\{(a_l-\hat{a}_l)^2\}$. A general closed-form expression for the individual distortions $D_{Q_l}$ has proven difficult to find except for Gaussian sources, however for large number of bits $b_l$, an expression has been found as $$D_{Q_l}(b_l) = \epsilon_l^2 \sigma_l^2 2^{-2b_l}, \quad (A22)$$

where $$\epsilon_l^2$$

is a constant that depends on the probability density function (pdf) of $a_l$, namely $p_l(a)$, as follows:

$$\epsilon_l^2 = \frac{1}{12}\left(\int_{-\infty}^{\infty} \tilde{p}_l(a)^{\frac{1}{3}} da\right)^3, \quad (A23)$$

where $\tilde{p}_l(a)=\sigma_l p_l(\sigma_l a)$. Therefore the average distortion introduced by the quantization process can be represented by $$\check{D}_Q = \frac{1}{N}\bar{D}_Q = \frac{1}{NT_c}\sum_{l=0}^{N-1} \epsilon_l^2 \sigma_l^2 2^{-2b_l}, \quad (A24)$$

where the division by $N$ is used to average across the coefficients.

At this point, one can find an optimal bit allocation among the N coefficients when the desired average number of bits per coefficient at the output of the ADC is a constant B, (i.e., find the set of number of bits $$b_l\big|_{l=0}^{N-1}$$

constrained to $$\sum_{l=0}^{N-1} b_l = BN$$

such that the distortion in Equation (A24) is minimized). This optimization problem can be solved using Lagrange multipliers as shown below, leading to $$b_l = B + \frac{1}{2}\log_2 \frac{\epsilon_l^2 \sigma_l^2}{\left(\prod_{l=0}^{N-1} \epsilon_l^2 \sigma_l^2\right)^{1/N}}. \quad (A25)$$

Similar to above, this solution assigns more bits to the coefficients with larger variance in order to make the distortion of all the coefficients uniform and equal to $$\breve{D}_{Q^*} = \frac{1}{T_c} D_{Q_t} = \frac{1}{T_c} \left( \prod_{t=0}^{N-1} \epsilon_t^2 \sigma_t^2 \right)^{1/N} 2^{-2B} \leq \breve{D}_Q. \quad (A26)$$

This bit allocation is equivalent to the concept of reverse water-filling found in rate distortion theory. One should note that if the variance of one coefficient is sufficiently small, the resultant number of bits from Equation (A25) could be negative, which could mean that the coefficient could be discarded. Additionally, the optimal solution in Equation (A25) can lead to a fractional number of bits $b_t$, which can be rounded off for practical application. This optimal bit allocation can be used in which the signal is linearly transformed to another domain before reducing its resolution in order to make more efficient its transmission over a communication channel. This technique is called blockbased transform coding and assumes that either the original digital data was obtained by means of high-resolution conventional A/D conversion at the Nyquist rate or did not require A/D conversion to be generated. This assumption constrains the utilization of the block-based transform coding to discrete applications where high-speed and high-resolution A/D conversion is not required. On the other hand, at least one the techniques discussed herein can be directly intended for A/D conversion since it performs sampling in the same domain where the quantization process is carried out.

One can also compare the performance of the A/D conversion based on signal projection with the conventional pulse code modulation (PCM) technique in which each time-domain sample is quantized with a constant number of bits B. The average distortion incurred in PCM assuming that N samples taken in a $T_c$ window comply with the Nyquist criteria can be represented by $$\overline{D}_{PCM} = \frac{1}{T_c} \epsilon_t^2 \sigma_t^2 2^{-2B}, \quad (A27)$$

where the sub-index t stands for time, $\epsilon_t$ depends on the pdf of a sample of the time-domain signal which is assumed stationary, $$\sigma_t^2$$

is the sample's variance, and B is large so that this expression holds in general.

Now, one can define a figure of merit of the proposed A/D conversion in orthogonal spaces, the orthogonal space A/D conversion versus time domain PCM A/D conversion gain (G). This nonlimiting example compares the performance of the proposed A/D method with the performance of an A/D conversion with PCM, defined as $$G = \frac{\overline{D}_{PCM}}{\breve{D}_Q + \overline{D}_N}. \quad (A28)$$

Letting $G^*$ be the gain obtained with the optimum number of coefficients $N^*$, $$G^* = \frac{\overline{D}_{PCM}}{\breve{D}_{Q^*} + \overline{D}_N}, \quad (A29)$$

which is the ratio between the distortion of PCM and the distortion introduced by both the limited number of coefficients and the quantization error when carrying out the A/D conversion via signal expansion. Substituting Equations (9), (11) and (17) into Equation (A28), yields $$G = \frac{\epsilon_t^2 \sigma_t^2 2^{-2B}}{\frac{1}{N} \sum_{t=0}^{N-1} \epsilon_t^2 \sigma_t^2 2^{-2b_t} + E_{s_1 T_c} - \sum_{t=0}^{N-1} \sigma_t^2} \leq \quad (A30)$$

$$\frac{\epsilon_t^2 \sigma_t^2 2^{-2B}}{\left( \prod_{t=0}^{N-1} \epsilon_t^2 \sigma_t^2 \right)^{1/N} 2^{-2B} + E_{s_1 T_c} - \sum_{t=0}^{N-1} \sigma_t^2}$$

One can then analyze the case in which the number of coefficients reaches the defined value $N^*$, which makes $\overline{D}_N$ zero. In this case, Equation (20) can be expressed as:

$$G = \frac{\epsilon_t^2 \sigma_t^2 2^{-2B}}{\frac{1}{N} \sum_{t=0}^{N-1} \epsilon_t^2 \sigma_t^2 2^{-2b_1}} \leq G^* = \quad (A31)$$

$$\frac{\epsilon_t^2 \sigma_t^2 2^{-2B}}{\left( \prod_{t=0}^{N-1} \epsilon_t^2 \sigma_t^2 \right)^{1/N} 2^{-2B}} = \frac{\epsilon_t^2}{\left( \prod_{t=0}^{N-1} \epsilon_t^2 \right)^{1/N}} \frac{\frac{1}{N} \sum_{t=0}^{N-1} \sigma_t^2}{\left( \prod_{t=0}^{N-1} \sigma_t^2 \right)^{1/N}},$$

where the last equality follows from the fact that the average energy of the coefficients $$a_t \big|_{t=0}^{N_*-1}$$

equals the time sample's variance since the error in Equation (A18) has zero energy. Equation (A31) shows the potential gain of a proposed method, as the orthogonal space A/D conversion gain is proportional to the ratio between the arithmetic mean of the orthogonal coefficients variances and the geometric mean of the same variances.

Since the arithmetic mean is generally greater than or equal to the geometric mean, being equal only when all the variances are the same, and in general $$\epsilon_t^2 \geq \left( \prod_{t=0}^{N-1} \epsilon_t^2 \right)^{1/N},$$

one can see that $G^* \geq 1$ or $\overline{D}_{PCM} \geq \breve{D}_Q^*$, under the same average number of bits B. One should note that a more uneven distribution of the variances leads to a larger gain, which can be advantageous in domains where the variance distribution is known or can be estimated.

One can assume that instead of being interested in taking advantage of the reduction in distortion offered by the A/D conversion via basis expansion, some embodiments can reduce the number of basis coefficients while keeping a level of distortion that is equal to the one obtained in time-domain A/D conversion with PCM, i.e., G=1. This means that in some embodiments, trading distortion gain for reduction in the number of parallel ADCs is desired. The question that arises here is how many coefficients $N_{G_u}$ are desired to obtain a unit gain ($G_u$=G=1) for a desired average number of bits B. Since symbolically solving for $N_{G_u}$ in terms of B from Equation (20) can be difficult, one can instead express B in terms of $N_{G_u}$ as follows $$B(N_{G_u}) = \frac{1}{2}\log_2\left(\frac{\epsilon_t^2\sigma_t^2 - \left(\prod_{t=0}^{N_{G_u}-1}\epsilon_t^2\sigma_t^2\right)^{1/N_{G_u}}}{E_{6,T_c} - \sum_{t=0}^{N_{G_u}-1}\sigma_t^2}\right). \quad (A32)$$

This means that if the gain G obtained in Equation (A30) is greater than 1 for some N≦N*, one can reduce the number of coefficients to $N_{G_u}$, leading to an implementation that requires fewer ADCs than the number of time-interleaved ADCs needed to achieve the same distortion and the same sampling rate.

Additionally, the synchronization challenges that appear in the time-interleaved ADC architectures due to the very fine time resolution, are relaxed in the orthogonal space ADC because the signal is quantized at the end of the time projection window $T_c$, which will be larger than the Nyquist period. One should note that the distortion gain or the reduction in the number of quantizers come at the cost of the alternative implementation of the circuitry needed in the projection of the input signal over the orthogonal basis.

The results presented thus far are suboptimal in the sense that the distortion measure is based on scalar quantization of individual coefficients, and only the bit distribution has been optimized. Better performance can be attained if the distortion measure is optimized jointly over all the coefficients, a concept known as vector quantization. However, practical ADCs can be implemented using scalar quantization in order to keep low levels of complexity. Optimal bit allocation together with scalar quantization provides an interesting gain as shown in Equation (A31), with a reasonable compromise in system complexity.

At this point one can ask whether there exists an orthogonal space that provides the best A/D conversion measured in MSE distortion. In other words, whether one can find a set of orthogonal functions $$\Phi_t(t)|_{t=0}^{N_*}$$

that expand an input signal s(t) leading to a minimum MSE for a given average number of bits B.

Intuitively, the set of orthogonal basis functions can provide a compact representation, so the number of coefficients N desired to achieve some level of distortion is minimal. Additionally, from Equation (A31), the optimal orthogonal space can minimize the geometric mean of the variances of coefficients. One could try to find a set of optimal orthogonal functions by setting up a constrained optimization problem. However, this nonlimiting example instead provides a discussion based on analogy with known results in linear transformations of discrete-time signals. One should note that in linear filter theory, when the Karhunen-Loéve transform (KLT) is applied to a zero mean, wide-sense stationary random input vector, the resultant output is a vector of uncorrelated random variables, i.e., the KLT diagonalizes the auto-correlation matrix of the discrete random process. This observation implies that the KLT provides a very compact representation of the input signal. This result can be proven by showing that the geometric mean of the variances of coefficients is minimized when the coefficients are obtained through the KLT. Unfortunately, the KLT can be difficult to use in practice as it generally desires signal stationarity, and the eigenvectors that constitute the basis of the transformation are available when the statistics of the input signal are known, conditions that are not easily met in real systems. In general, it is desirable for a practical application to have an orthogonal space that is signal independent. To this end, the frequency domain provides a well understood orthogonal space for A/D conversion based on signal projection, which is described in more detail below.

One should note that, while the frequency domain is discussed herein, this is a nonlimiting example of a domain that can be used to achieve a desired result. Other domains may also be used, depending on the desired configuration.

The ADC via signal expansion introduces a time delay as the signal information of the last $T_c$ seconds is transferred to a new domain and condensed into N coefficients. This latency should be properly chosen according to the specific application. For instance, in a communications system, a proper choice of $T_c$ could be a number less than or equal to the transmitted symbol period T. Additionally, the nature of this ADC leads to carrying out digital signal processing (DSP) applications in the same domain used in the A/D conversion itself.

As a nonlimiting example of a practical application of the ideas presented herein (and with reference to element 102a from FIG. 3A), one can investigate the design of mixed-signal communications receivers based on the ADC ideas presented in this disclosure. Embodiments of receivers can include mixed-signals in the sense that in their analog front end, signal projection over basis functions is performed before the parallel ADCs are applied. Additionally, the information bits can be detected through a discrete matched filter operation that takes place in the domain on which the received signal has been expanded.

More specifically, one can assume that the signal s(t) is transmitted over a linear communication channel with impulse response h(t)

$$r(t)=s(t)*h(t)+z(t), 0 \leq t \leq T. \quad (A33)$$

where "*" indicates continuous-time convolution and z(t) is additive white Gaussian noise (AWGN). In a typical conventional all-digital linear communication receivers, the received continuous-time signal is first passed through a time-domain A/D converter running at Nyquist rate, and the discrete-time samples are then demodulated by performing a discrete-time linear filtering operation. The following analysis presents a fundamentally different approach for the implementation of all-digital linear receivers, based on the coefficients obtained from A/D conversion after signal expansion.

Assume that the transmitted signal s(t) conveys the information symbol a. In order to obtain an estimate of the transmitted symbol from the set of basis coefficients, one can begin by expressing the receiver structure as a linear filtering problem in the time domain $$\hat{a} = r(t) * p(t)|_{t=T} = \int_0^T r(\tau)p(T-\tau)d\tau, \quad (A34)$$

where â is the symbol estimate, p(t) is the impulse response of the linear filter demodulator which can be a simple matched filter, a RAKE receiver, an MMSE receiver, etc. The output of this filter is sampled at t=T. For convenience, Equation (A34) can be expressed as $$\hat{a} = \int_0^T r(\tau)p(T-\tau)d\tau = \int_0^T r(\tau)g^*(\tau)d\tau, \quad (A35)$$

where one can define $g^+(\tau)=p(T-\tau)$. Now, one can proceed to segment the symbol duration time T into M time-slots of duration $T_c$. One can also define the following signals $$r_m(t)=r(t)w_m(t) \quad (A36)$$

$$g_m(t)=g(t)w_m(t), \quad (A37)$$

For M=0, . . . , M-1 and the window $w_m(t)$ introduced in Equation (A37) can be selected as rectangular for simplicity of the analysis, although as mentioned earlier other windows with desired characteristics could be used instead.

Using these definitions, the linear receiver output in (A34) can be expressed as $$\hat{a} = \sum_{m=0}^{M-1} \int_{mT_e}^{(m+1)T_e} r(\tau)g^*(\tau)d\tau \quad (A38)$$

$$= \sum_{m=0}^{M-1} \int_{mT_e}^{(m+1)T_e} r_m(\tau)g_m^*(\tau)d\tau$$

$$= \sum_{m=0}^{M-1} \int_{-\infty}^{\infty} r_m(\tau)g_m^*(\tau)d\tau,$$

in which the integral in Equation (A34) has been segmented into M integrals that run over intervals of duration $T_c$ each, such that $T=MT_c$.

Figure 3A:
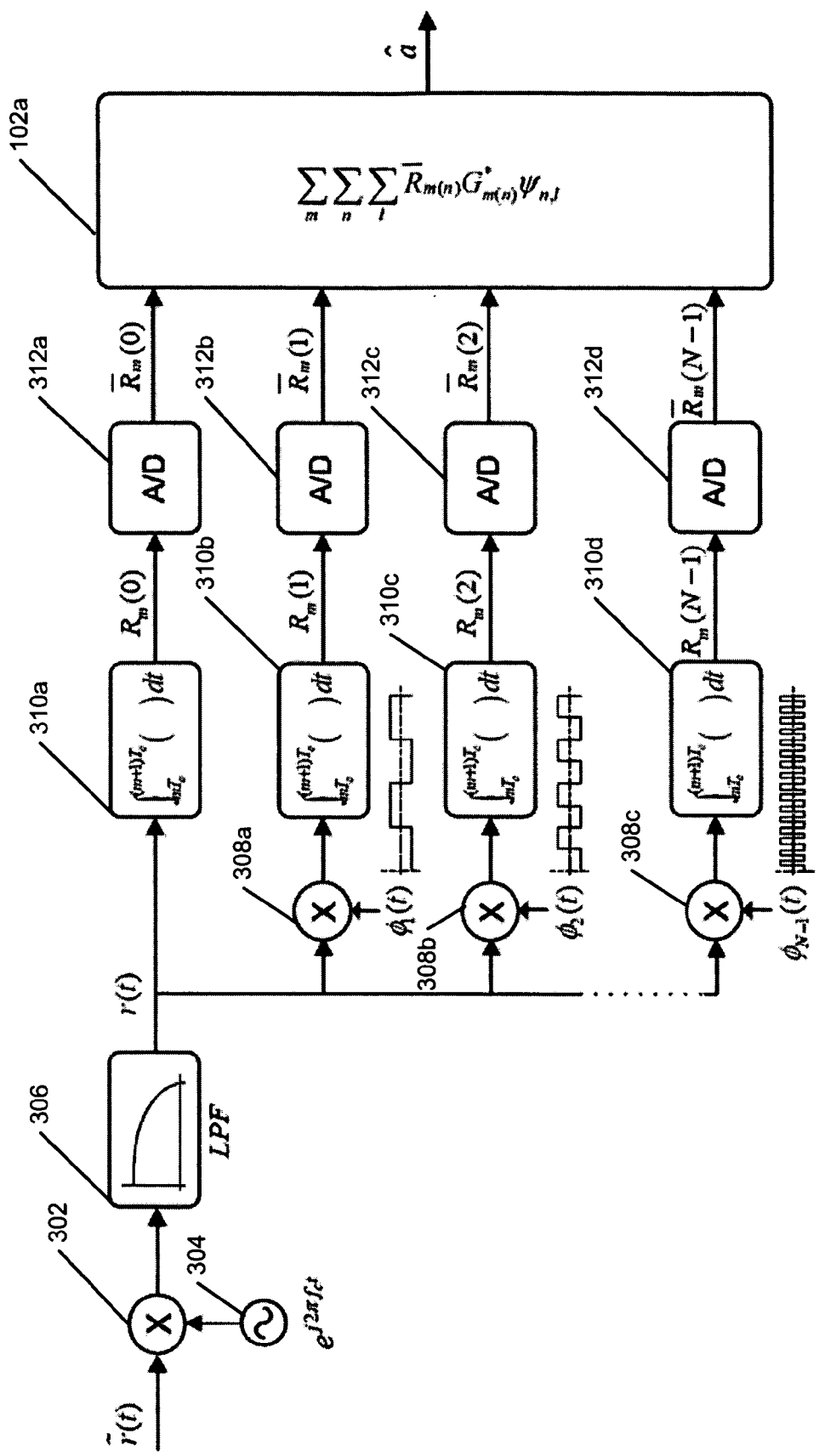
FIG. 3A is an exemplary block diagram of a mixed signal receiver with an analog to digital conversion via signal expansion, similar to the block diagram from FIG. 1.

In order to express the matched filter operations in the new conversion domain, the signal expansion over the basis functions $\Phi_i(t)$ is used to represent both the segmented received signal and segmented receive filter, leading to $$\hat{a} = \sum_{m=0}^{M-1} \int_{-\infty}^{\infty} r_m(\tau)g_m^*(\tau)d\tau \quad (A39)$$

$$= \sum_{m=0}^{M-1} \int_{-\infty}^{\infty} \sum_{n=0}^{\infty} R_m(n)\Phi_n(\tau) \sum_{l=0}^{\infty} G_m^*(l)\Phi_l^*(\tau)d\tau$$

$$= \sum_{m=0}^{M-1} \sum_{n=0}^{\infty} \sum_{l=0}^{\infty} R_m(n)G_m^*(l) \int_{-\infty}^{\infty} \Phi_n(\tau)\Phi_l^*(\tau)d\tau$$

$$= \sum_{m=0}^{M-1} \sum_{n=0}^{\infty} \sum_{l=0}^{\infty} R_m(n)G_m^*(l)\psi_{n,l}$$

$$\approx \sum_{m=0}^{M-1} \sum_{n=0}^{N-1} \sum_{l=0}^{N-1} R_m(n)G_m^*(l)\psi_{n,l},$$

where $$R_m(n)|_{n=0}^{N-1}$$

and $$G_m(l)|_{l=0}^{N-1}$$

are the best MSE coefficients representation as explained in Equation (A14), which can include reversing the linear transformation of Equation (A13). One should note that the series expansion in Equation (A39) has been truncated, leading to some degree of error. Although this truncation error should in principle degrade the receiver performance, as shown below, any desired performance can be achieved if the trade off between complexity in terms of number of coefficients N, and sampling speed $\Delta F_c=1/T_c=M/T$, is adequately set up. One should also note that if the basis functions are orthonormal, (A39) reduces to $$\hat{a} \approx \sum_{m=0}^{M-1} \sum_{n=0}^{N-1} R_m(n)G_m^*(n), \quad (A40)$$

which reduced the complexity of detection. The trade-off between the choice of the basis functions, complexity of the detection formula, and the degree of truncation error is fundamental in the receiver design. FIG. 3A illustrates the mixed-signal receiver architecture.

FIG. 3A is an exemplary block diagram of a mixed signal receiver with an analog to digital conversion via signal expansion, similar to the block diagram from FIG. 1. More specifically, the frequency domain emerges as an appealing domain for the analog to digital conversion of signals with very large bandwidth, since in principle it relaxes the extremely fine time resolution needed in time-domain ADCs, and provides a scalable architecture. The timing requirements are relaxed since the sampling is performed at a rate that is lower than the one imposed by Nyquist criteria.

As illustrated in FIG. 3A, the receiver can include a first combiner 302 and a low pass filter 306. Also included are a plurality of second combiners 306a, 306b, and 306c and a plurality of integration function 308a, 308b, 308c, and 308d, which can facilitate division of a received analog signal. Additionally included ire a plurality of analog to digital converters 310a, 310b, 310c, and 310d, and summing logic 312, which can provide a desired signal â.

Figure 3B:
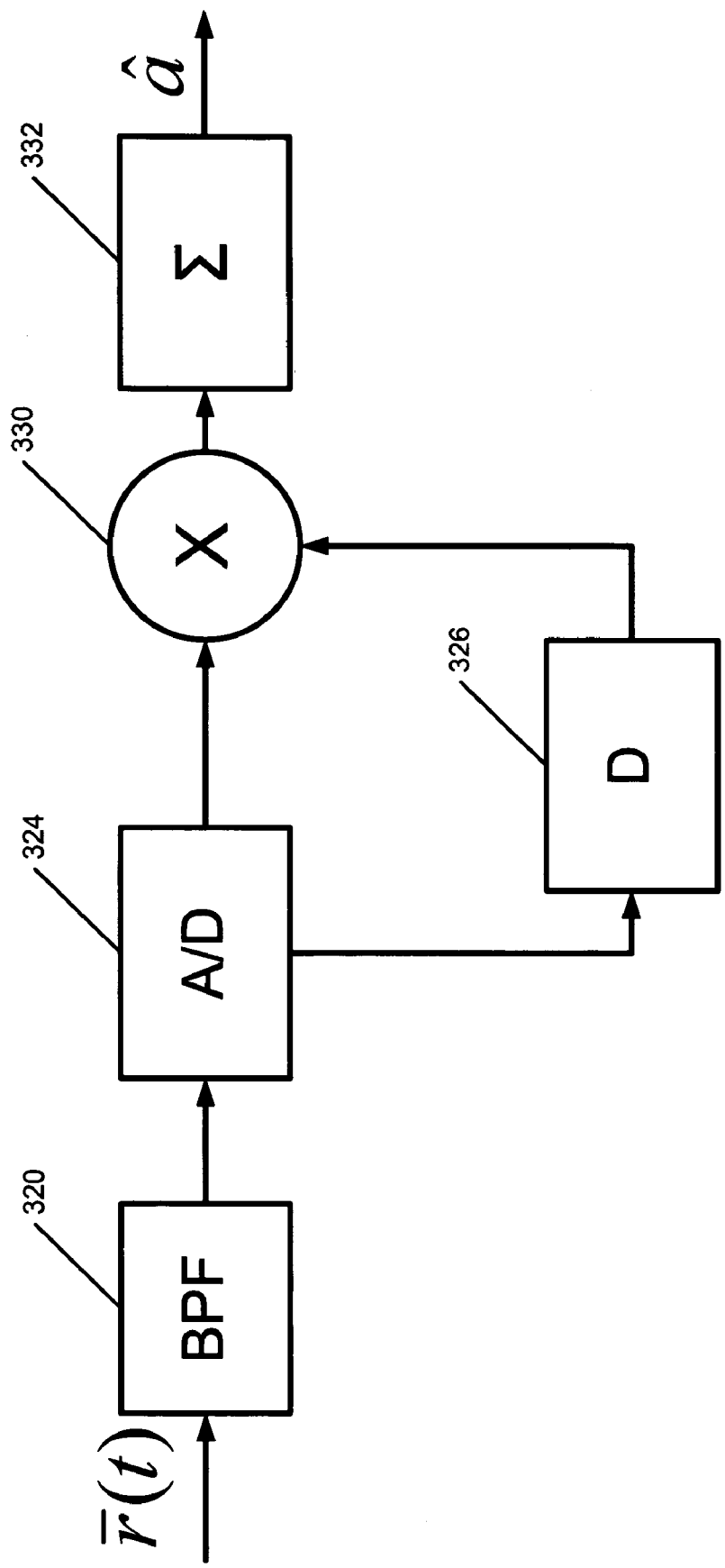
FIG. 3B is an exemplary block diagram of a transmitted reference receiver that can be configured to operate in a continuous time-domain, similar to the block diagram from FIG. 3A.

FIG. 3B is an exemplary block diagram of a transmitted reference receiver that can be configured to operate in a continuous time-domain, similar to the block diagram from FIG. 3A. In this nonlimiting example, one can consider the design of a mixed-signal multi-carrier receiver based on "UWB Mixed-Signal Transform-Domain Receiver Front-End Architectures", written by Sebastian Hoyos and Brian Sadler, which is hereby incorporated by reference in its entirety. Additionally incorporated by reference in their entireties are "High-speed A/D Conversion for Ultra-Wideband Signals Based on Signal Projection Over Basis Functions" by Hoyos, Sadler, and Arce; "Analog to Digital Conversion of Ultra-Wideband Signals in Orthogonal Spaces" by Hoyos, Sadler, and Arce; and "Ultra-Wideband Analog-to-Digital Conversion Via Signal Expansion" by Hoyos and Sadler.

With specific reference to FIG. 3B, a continuous time domain version of a transmitted-reference receiver can include a band pass filter 320, an analog to digital converter 324, a multiplier 328, and a summer 330.

Figure 3C:
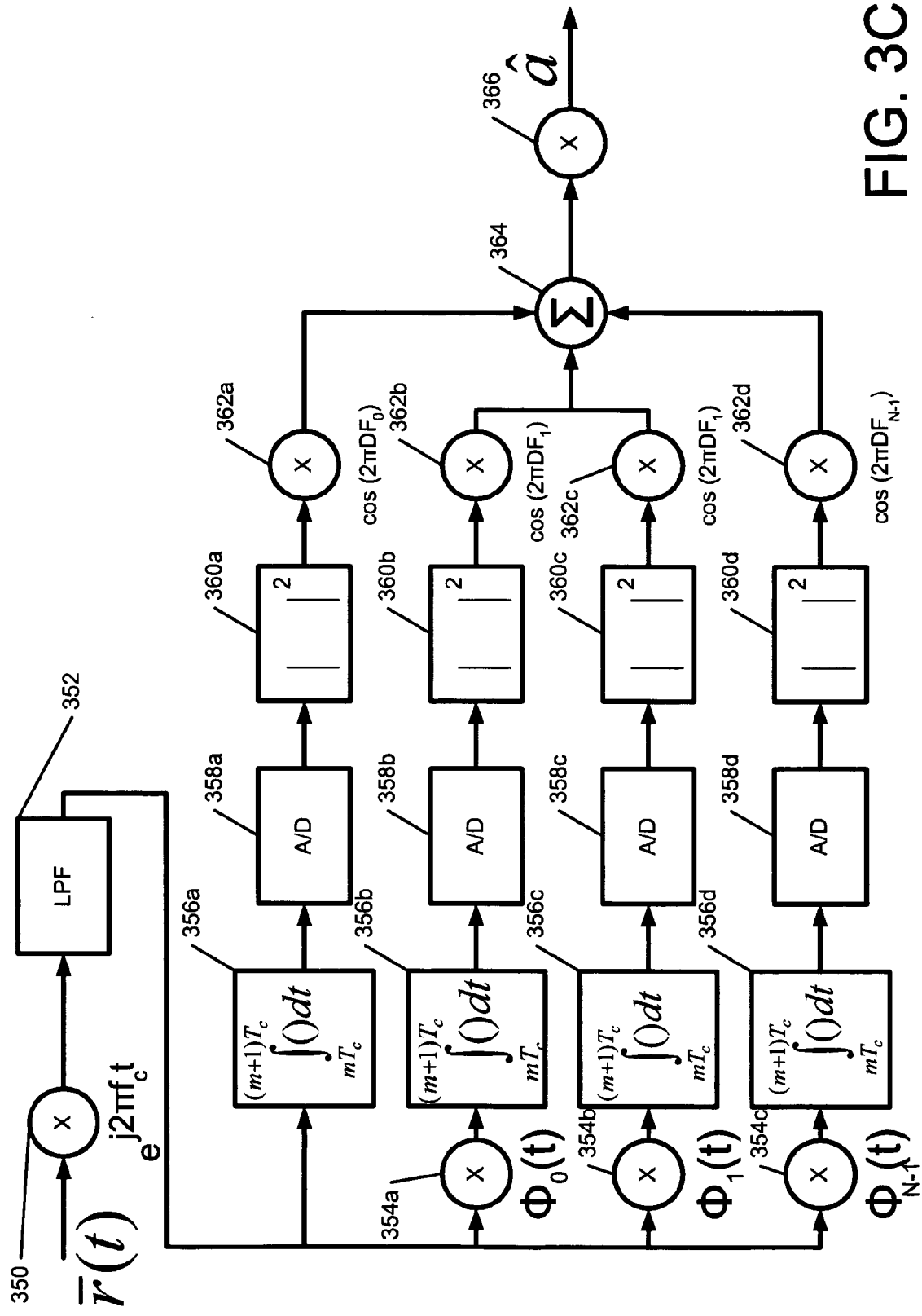
FIG. 3C is an exemplary block diagram of a transmitted reference receiver that is configured to operated in a mixed signal implementation, similar to the block diagram from FIG. 3A.

FIG. 3C is an exemplary block diagram of a transmitted reference receiver that is configured to operated in a mixed signal implementation, similar to the block diagram from FIG. 3.A. More specifically, included in the mixed signal implementation of a transmitted-reference receiver is a first combiner 350, a low pass filter 352, a plurality of second combiners 354a, 354b, and 354c. Also included are integration functions 356a, 356b, 356c, and 356d, analog to digital converters 358a, 358b, 358c, and 358d. Exponential functions 360a, 360b, 360c, and 360d are also included, as well as third combiners a summer 364 and a fourth combiner 366.

Figure 4:
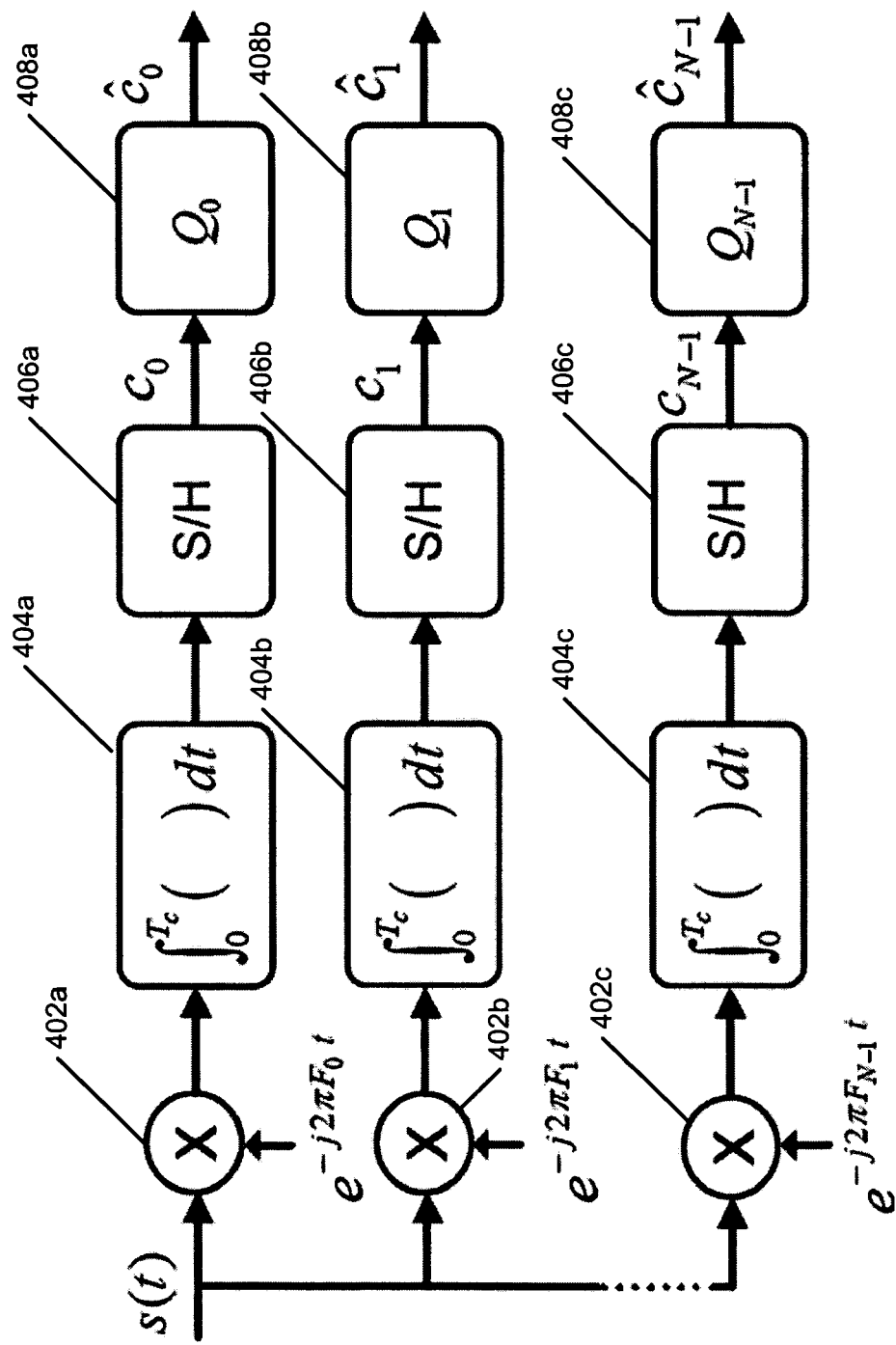
FIG. 4 is an exemplary block diagram of a frequency domain analog to digital converter, similar to the block diagram from FIG. 1.

FIG. 4 is an exemplary block diagram of a frequency domain analog to digital converter, similar to the block diagram from FIG. 1. More specifically, FIG. 4 shows a block diagram of the frequency domain ADC in which the complex exponential functions of t at 402a, 402b, and 402c (see also 404a, 404b, and 404c) that constitute the orthogonal basis allow sampling of the continuous-time signal at the frequencies $$F_l \vert_{l=0}^{N-1},$$

leading to the set of frequency coefficients $$c_l = \int_0^{T_c} s(t) e^{-j 2\pi F_l t} \, dt, l = 0, \ldots, N-1. \quad (A41)$$

These coefficients can then be quantized by a set of quantizers 408a, 408b, 408c, and 408d $$Q_l \vert_{l=0}^{N-1},$$

which in turn produce the ADC output digital coefficients $$\hat{c}_l \vert_{l=0}^{N-1}.$$

The frequency sample spacing $\Delta F = F_l - F_{l-1}$ complies with $$\Delta F \le \frac{1}{T_c}$$

in order to avoid aliasing in the discrete-time domain. Thus, the optimal number of coefficients N* necessary to fully sample the signal spectrum with bandwidth W, without introducing time aliasing, is proportional to the time-bandwidth product $$N_* = \left\lceil \frac{W}{\Delta F} + 1 \right\rceil \ge \lceil W T_c + 1 \rceil, \quad (A42)$$

where the operator ⌈ ⌉ is used to ensure that N* is the closest upper integer that avoids discrete-time aliasing. Because signals found in applications are time-limited, the term bandwidth here refers to the range of frequencies in which the signal power is larger than some defined power level, for instance, many signal bandwidths are defined at 3 dB of attenuation, although more conservative attenuation could be desirable for some applications such as A/D conversion. Moreover, the bandwidth W described herein is the bandwidth of the time-segmented signal which in general is larger than the bandwidth of the signal s(t), as the segmentation introduces side-lobes that can be sampled in order to obtain lower distortion error. When $$\Delta F = \frac{1}{T_c},$$

Equation (A42) becomes an equality and the discrete-time alias-free condition is satisfied without oversampling of the frequency spectrum.

One should note that the frequency-domain ADC can be fundamentally different from the ADC architectures based on filter bank theory. The difference lies in the fact that the frequency domain ADC samples the expansion of time-segments of the received signal, whereas the filter bank approach performs frequency channelization. The computation of Fourier samples, via mixing and integration, can be thought of as synthesizing a filter bank. However, these filters are very broad with smooth transitions. In fact, the frequency response of the branches in FIG. 3A can overlap with each other, but this overlapping does not introduce ADC distortion. On the other hand, the filter bank approach generally requires filters with very sharp roll-off and any leakage between the channels will seriously degrade the ADC performance. This is an important motivation for the implementation of the frequency domain ADC.

Figure 5A:
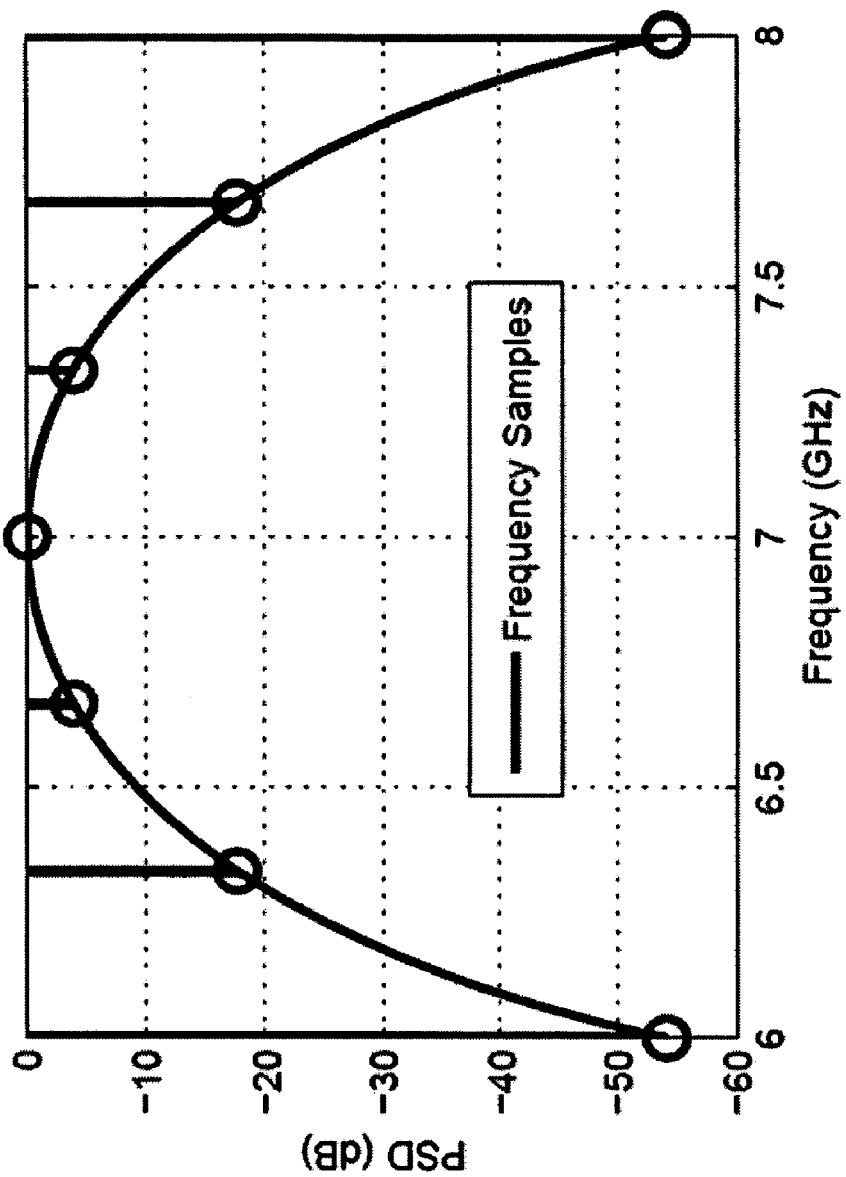
FIG. 5A is an exemplary raised cosine shaped power spectrum of a Gaussian source for analog to digital conversion, such as in the analog to digital converter from FIG. 4.

FIG. 5A is an exemplary raised cosine shaped power spectrum of a Gaussian source for analog to digital conversion, such as in the analog to digital converter from FIG. 4. More specifically, as a nonlimiting example, one can consider a stationary zero-mean Gaussian continuous source with variance $$\sigma_t^2,$$

bandwidth W=2 GHz @ −55 dB, central frequency $F_c$=7 GHz and a power spectrum density (PSD) shown in FIG. 5A. Notice that in this case the signal PSD provides the information about the coefficient's variance distribution needed in the optimal bit allocation. The signal is segmented in intervals of $T_c$=3 ns to be A/D converted, thus requiring a frequency spacing between samples of $\Delta F = 1/T_c$=333.33 MHz to avoid aliasing in the discrete-time equivalent signal. The bits are optimally distributed among the coefficients as indicated by Equation (15), leading to the set of curves of MSE distortion versus average number of bits B discussed below.

Figure 5B:
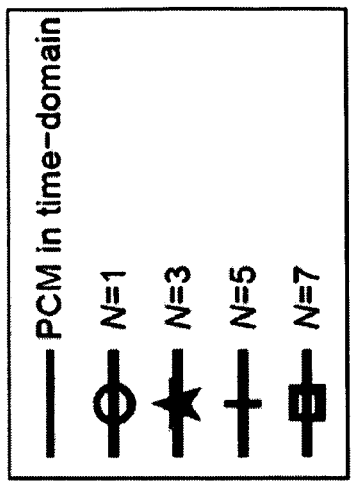
FIG. 5B is an exemplary graphical comparison between a Mean Square Error (MSE) distortion of a time domain Pulse Code Modulation (PCM) analog to digital converter, such as the analog to digital converter from FIG. 3B.
Figure 5B:
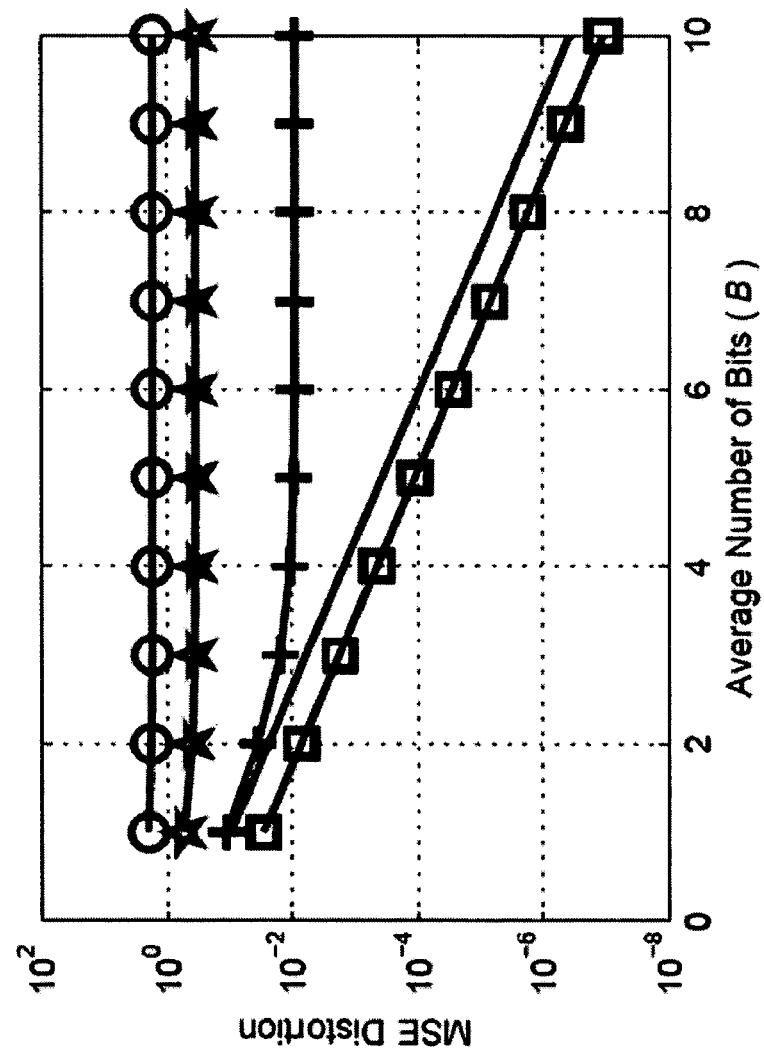

FIG. 5B is an exemplary graphical comparison between a Mean Square Error (MSE) distortion of a time domain Pulse Code Modulation (PCM) analog to digital converter, such as the analog to digital converter from FIG. 3B. More specifically, MSE distortion for PCM is shown for comparison purposes.

Figure 5C:
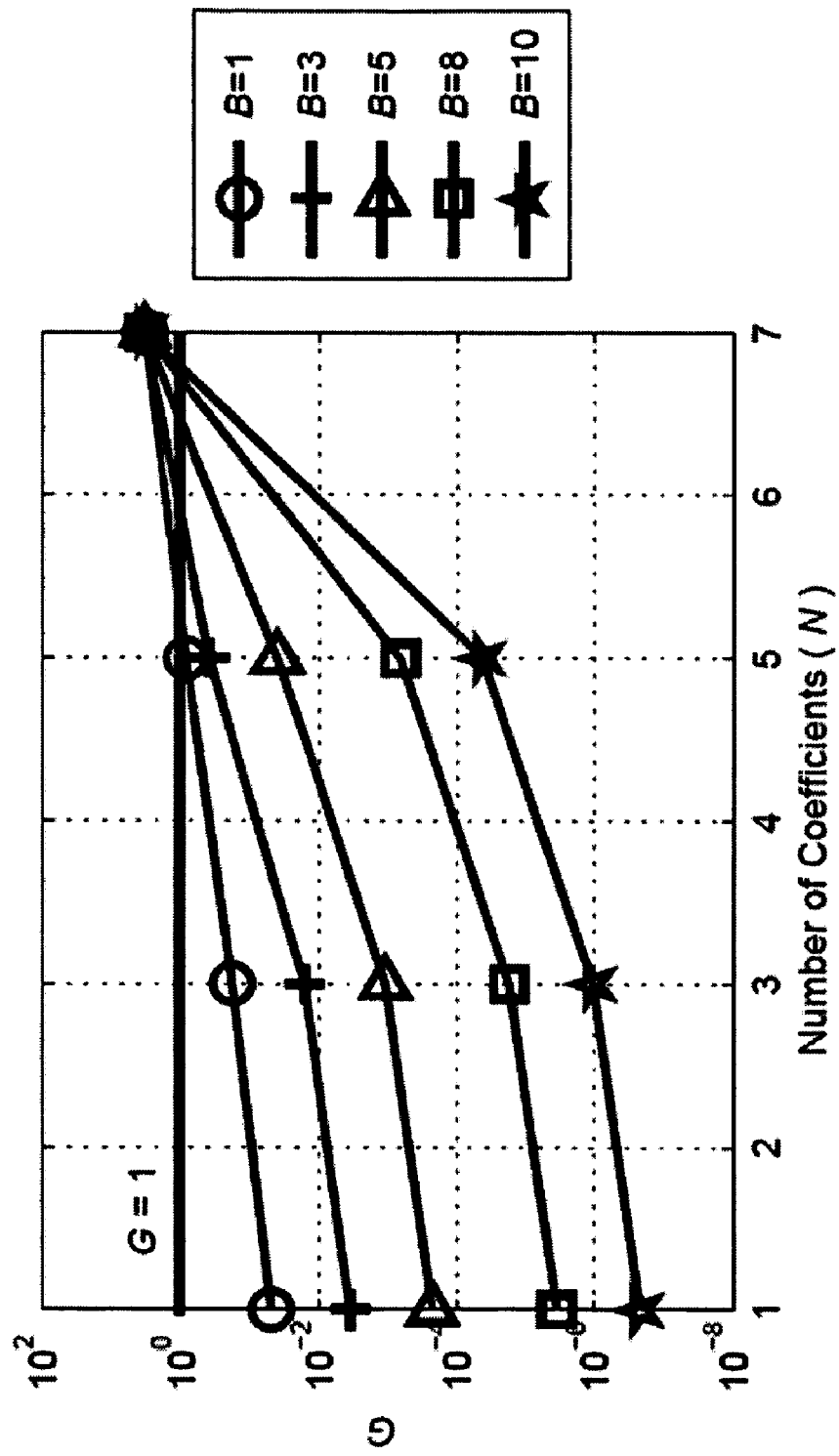
FIG. 5C is an exemplary graphical comparison of gain versus the number of coefficients for an average number of bits in an analog to digital conversion, such as the analog to digital converter from FIG. 4.

FIG. 5C is an exemplary graphical comparison of gain versus the number of coefficients for an average number of bits in an analog to digital conversion, such as the analog to digital converter from FIG. 4. The A/D conversion gain (G) is plotted in FIG. 5C against the number of coefficients N (N*=7) for several values of average number of bits B. These drawings show the potential gain of performing the A/D conversion in the frequency domain together with optimal bit allocation, especially when the target average number of bits is low. For this nonlimiting example, a gain of up to 3.35 (5.25 dB) can be achieved when N*=7 coefficients are implemented.

Further, assume that a mono-bit (i.e., B=1) implementation is desired and lowering the sampling rate is the main concern in the design. So, one may desire to trade distortion gain for a lower sampling rate of the ADCs. FIG. 5C shows that a mono-bit implementation with N=5 coefficients (9 real-valued ADCs since the DC-frequency coefficient requires just 1 ADC while the other complex-valued frequency samples require 2 ADCs) can achieve the same distortion rate of a time-domain ADC with PCM. However, the frequency-domain ADC operates at $1=T_c$=333:33 MHz whereas the time-domain ADC requires a sampling rate of 4 GHz to meet the Nyquist criterion. If a time-interleaved architecture is implemented in the time domain ADC to reduce the speed of the comparators to 333.33 MHz, a total of 12 ADCs can be used, leading to an implementation that requires 3 more ADCs than the frequency domain ADC implementation. One should note that although the MSE distortion in Equation (A22) is generally valid for a large number of bits, for Gaussian sources the expression holds asymptotically even for a small number of bits, so the curves in FIGS. 5A, 5B, and 5C are exact under the assumptions of this example.

Additionally, one can calculate the signal to noise and distortion error for the frequency domain ADC that includes gain distortions, timing errors, frequency offsets and additive noise in all the paths of the ADC. It is assumed that a testing sinusoidal signal $r(t)=A \cos(2\pi F_x t)$ is driven to the ADC input. The frequency samples provided by the ADC under distortion and noise can be expressed as $$\tilde{R}(F_n) = g_n \int_{-T_c/2}^{T_c/2} r(t - \Delta t_n) e^{-j2\pi(F_n - \Delta F_n)t} dt + o_n, n = 0, \ldots, N-1. \quad (A43)$$

where $g_n$ is the gain distortion, $\Delta t_n$ is the time error, $\Delta F_n$ is the frequency offset and $o_n$ is the additive noise associated with the nth frequency sample. For the specific case of a test signal $r(t)=A \cos(2\pi F_x t)$ and using the identity $\cos(2\pi F_x(t-\Delta t_n))=\cos(2\pi F_x t)\cos(2\pi F_x \Delta t_n)+\sin(2\pi F_x t)\sin(2\pi F_x \Delta t_n)$, Equation (A43) reduces to $$\tilde{R}(F_n) = g_n \int_{-T_c/2}^{T_c/2} A\cos(2\pi F_x(t-\Delta t_n)) e^{-j2\pi(F_n-\Delta F_n)t} dt + \quad (A44)$$
$$o_n$$
$$= A g_n \left( \cos(2\pi F_x \Delta t_n) \int_{-T_c/2}^{T_c/2} \cos(2\pi F_x t) e^{-j2\pi(F_n-\Delta F_n)t} dt + \sin(2\pi F_x \Delta t_n) \int_{-T_c/2}^{T_c/2} \sin(2\pi F_x t) e^{-j2\pi(F_n-\Delta F_n)t} dt \right)$$
$$= A g_n \left( \cos(2\pi F_x \Delta t_n) \int_{-T_c/2}^{T_c/2} \cos(2\pi F_x t) e^{-j2\pi(F_n-\Delta F_n)t} dt - j\sin(2\pi F_x \Delta t_n) \int_{-T_c/2}^{T_c/2} \cos(2\pi F_x t) e^{-j2\pi(F_n-\Delta F_n)t} dt \right)$$
$$= A g_n R(F_n + \Delta F_n) e^{-j2\pi F_x \Delta t_n} + o_n,$$

Wherein $R(F_n)$ is given by $$R(F_n) = \frac{\sin(\pi T_c(F_n - F_x))}{\pi T_c(F_n - F_x)}. \quad (A45)$$

It can be noted from Equation (A45) that if there are no frequency offsets, only the sample $R(F_x)$ will be nonzero since all the other samples align with the nulls of Equation (A45).

The SNDR can be given by the ratio of the power at the frequency of interest $F_x$, and the sum of the powers at all the other frequencies $F_n$. One should note that the phase rotation of the sample $\tilde{R}(F_z)$ due to time jitter will degrade the SNDR. To see this, one can express $\tilde{R}(F_x)$ in real and imaginary parts $$\tilde{R}(F_x)=Ag_x R(F_n+\Delta F_x)\cos(2\pi F_x \Delta t_x)+o_{xR}+ $$
$$j*(A g_x R(F_n+\Delta F_x)\sin(2\pi F_x \Delta t_x)+o_{xI}) \quad (A46)$$

where $o_x R=\text{Re}\{o_x\}$ and $o_{xI}=\text{Im}\{o_x\}$. The real part of $\tilde{R}(F_x)$ corresponds to the signal component whereas the imaginary part of $\tilde{R}(F_x)$ introduces distortion, where the amount of jitter $\Delta t_x$ determines how much distortion is introduced. Thus, the SNDR is given by $$SNDR = 10\log_{10}\left( \frac{E\{|\text{Re}\{\tilde{R}(F_x)\}|^2\}}{\sum_{\substack{n=0 \\ n \neq x}}^{N-1} E\{|\tilde{R}(F_n)|^2\} + E\{|\text{Im}\{\tilde{R}(F_x)\}|^2\}} \right), \quad (A47)$$

where the orthogonality among the frequency samples allows an expression of an expected value of the sum as a sum of expected values. The numerator in Equation (A47) is the signal power component, which as shown below can be approximated as $$E\{|\text{Re}\{\tilde{R}(F_x)\}|^2\} \approx A^2 \sigma_g^2 \left(1 - \frac{\pi^2}{3}\sigma_{\Delta F}^2\right)(1 - 4\pi^2 \sigma_{\Delta tx}^2) + \frac{1}{2}\sigma_o^2 \quad (A48)$$

where $$\sigma_g^2 = E\{g_n^2\}|_{n=0}^{N-1}, \sigma_{\Delta F}^2 = \frac{E\{\Delta F_n^2\}}{\Delta F_c^2}\bigg|_{n=0}^{N-1} \text{ and } \sigma_{\Delta tx}^2 = F_x^2 E\{\Delta t_x^2\}$$

which assumes that the distortions in all the paths have the same second order moments. Notice that the parameters $$\sigma_{\Delta F}^2$$

and $$\sigma_{\Delta tx}^2$$

have included the normalization factors $$\frac{1}{\Delta F_c^2}$$

and $$F_x^2,$$

respectively.

The noise terms in the sum of the denominator of Equation (A47) are shown below to be $$E\{|\tilde{R}(F_n)|^2\} \approx A^2 \sigma_{\Delta F}^2 \sigma_g^2 (n-x)^{-2} + \sigma_o^2. \quad (A49)$$

The noise term due to the imaginary part of $\tilde{R}(F_x)$ is also approximated below as $$E\{|\text{Im}\{\tilde{R}(F_x)\}|^2\} \approx A^2 \sigma_g^2 \left(1 - \frac{\pi^2}{3}\sigma_{\Delta F}^2\right)(4\pi^2 \sigma_{\Delta tx}^2) + \frac{1}{2}\sigma_o^2 \quad (A50)$$

These results lead to the following expression for the SNDR, $$SNDR = 10\log_{10}\left(\frac{A^2\sigma_g^2\left(1 - \frac{\pi^2}{3}\sigma_{\Delta F}^2\right)(1 - 4\pi^2\sigma_{\Delta tx}^2) + \frac{1}{2}\sigma_o^2}{A^2\sigma_g^2\left(\sigma_{\Delta F}^2 \sum_{\substack{n=0 \\ n\neq x}}^{N-1} (n-x)^{-2} + \left(1 - \frac{\pi^2}{3}\sigma_{\Delta F}^2\right)(4\pi^2\sigma_{\Delta tx}^2)\right) + \left(N - \frac{1}{2}\right)\sigma_o^2}\right). \quad \text{(A51)}$$

This expression reveals several interesting results. For instance, the gain variance has little or no effect on the SNDR if the additive noise second order moment is zero, which in practice means little impact on the SNDR for reasonable values of $$\sigma_o^2.$$

Setting $$\sigma_g^2 = 0, \sigma_{\Delta tx}^2 = 0,$$

and $$\sigma_o^2 = 0,$$

yields the SNDR due to frequency offset $$SNDR = 10\log_{10}\left(\frac{\left(1 - \frac{\pi^2}{3}\sigma_{\Delta F}^2\right)}{\sigma_{\Delta F}^2 \sum_{\substack{n=0 \\ n\neq x}}^{N-1} (n-x)^{-2}}\right). \quad \text{(A52)}$$

With $$\sigma_g^2 = 0, \sigma_{\Delta F}^2 = 0,$$

and $$\sigma_o^2 = 0$$

one can find the SNDR due to time jitter $$SNDR = 10\log_{10}\left(\frac{(1 - 4\pi^2\sigma_{\Delta tx}^2)}{4\pi^2\sigma_{\Delta tx}^2}\right), \quad \text{(A53)}$$

and setting $$\sigma_g^2 = 0, \sigma_{\Delta F}^2 = 0,$$

and $$\sigma_{\Delta tx}^2 = 0,$$

one can find the SNDR due to amplitude offset $$SNDR = 10\log_{10}\left(\frac{\frac{1}{2}}{\left(N - \frac{1}{2}\right)}\right). \quad \text{(A54)}$$

Figure 6A:
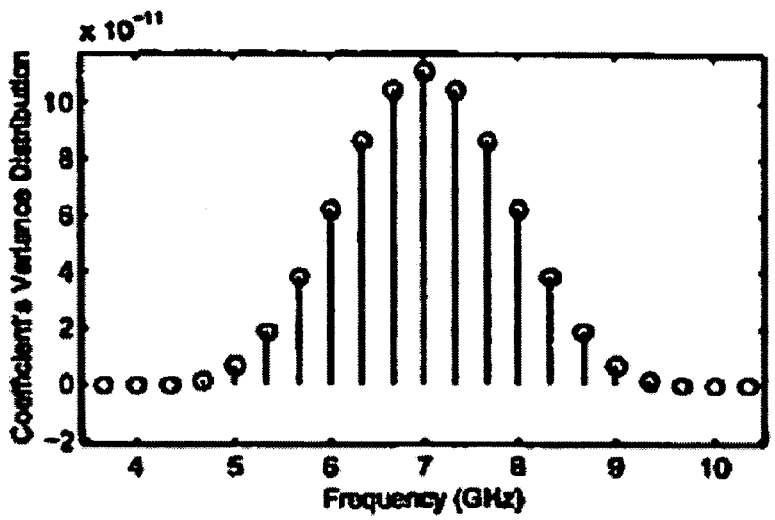
FIG. 6A is an exemplary raised cosine shaped power spectrum of a Gaussian source for analog to digital conversion, similar to the power spectrum from FIG. 5A.

FIG. 6A is an exemplary raised cosine shaped power spectrum of a Gaussian source for analog to digital conversion, similar to the power spectrum from FIG. 5A. As illustrated, a plot of coefficient's variance distribution versus frequency is plotted. The variance scale ranges from zero to 10, and the frequency (in GHz) ranges from zero to 10.

Figure 6B:
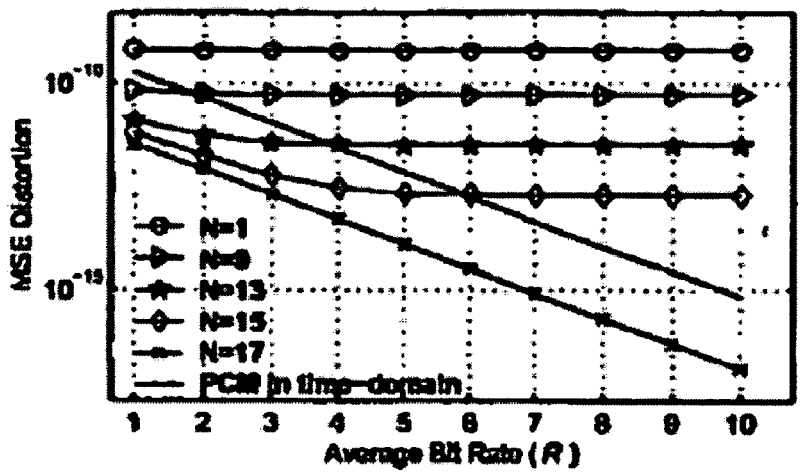
FIG. 6B is exemplary graphical comparison between a Mean Square Error (MSE) distortion of a time domain Pulse Code Modulation (PCM) analog to digital converter, similar to the comparison in FIG. 5B.

FIG. 6B is exemplary graphical comparison between a Mean Square Error (MSE) distortion of a time domain Pulse Code Modulation (PCM) analog to digital converter, similar to the comparison in FIG. 5B. More specifically, Mean Square Error distribution is plotted against average bit rate for various values of N. As illustrated N can take the value of 1, 3, 13, 15, and 17. Additionally included in this nonlimiting example is a plot of PCM in time domain. One should note that N can be any integer value. Although the description with regard to FIG. 6B illustrates n as including values of 1, 3, 13, 15, and 17, these are nonlimiting examples, as N is a flexible design parameter that, depending on the desired configuration can take any integer value.

Figure 6C:
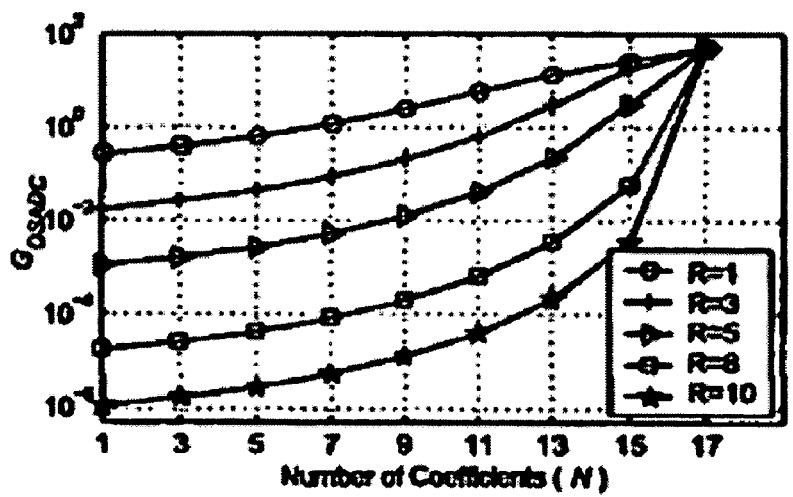
FIG. 6C is an exemplary graphical illustration of orthogonal space analog to digital gain against the number of coefficients for a plurality of average bit rates, similar to the graphical representation from FIG. 5C.

FIG. 6C is an exemplary graphical illustration of a orthogonal space analog to digital gain against the number of coefficients for a plurality of average bit rates, similar to the graphical representation from FIG. 5C. As illustrated, R can take the value of 1, 3, 5, 8, and 10. Additionally, this nonlimiting example illustrates that gain converges at $10^2$, when the number of coefficients=17. One should note that R can be any integer value. Although the description with regard to FIG. 6C illustrates n as including values of 1, 3, 5, 8, and 10, these are nonlimiting examples, as above.

With regard to FIGS. 6A-6C, the frequency domain emerges as an appealing domain for the analog to digital conversion of signals with very large bandwidths since it relaxes the extremely fine time resolutions needed in time-domain ADCs. As described above, FIG. 4 shows the block diagram of the frequency domain ADC in which samples of the continuous-time signal spectrum at the frequencies $$F_l\,|_{l=0}^{N-1}$$

are taken, leading to the set of frequency coefficients $$l = 0, \cdots, N-1. \quad \text{(A55)}$$

These coefficients are then quantized by a set of quantizers $$Q_l(x)\,|_{l=0}^{N-1}$$

that, in turn, produce the ADC output digital coefficients $$\overline{c}_l\,|_{l=0}^{N-1}.$$

The frequency sample spacing $\Delta F = F_l - F_{l-1}$ complies with $$\Delta F \leq \frac{1}{T}$$

in order to avoid aliasing in the discrete-time domain. Thus, the minimum number of coefficients N necessary to sample a signal spectrum with bandwidth W, without introducing time aliasing, is proportional to the time-bandwidth product $$N = \frac{W}{\Delta F} + 1 \geq WT_c + 1. \tag{A56}$$

Assuming that the input signal s(t) is real-valued, the coefficients $$c_l |_{l=0}^{N-1}$$

are generally related to the discrete Fourier transform (DFT) coefficients as follows $$S(k) = [S(0), S(1), \cdots, S(K-1)] \tag{A57}$$
$$= F_s[c_0, c_1, \cdots, c_{N-1}, c_{N-2}^*, \cdots, c_1^*],$$

where one can assume that samples are taken from 0 Hz; "*" denotes the complex conjugate, $F_s = K/T_c$, is the time sampling frequency and $k=0, \ldots, K-1$. So, if N samples are taken from the spectrum of the real-valued continuous-time signal, $K=2(N-1)$ DFT coefficients are obtained and these coefficients constitute the digital representation of the time-domain signal. The relationship in Equation (A57) is valid when the K samples of the continuous time signal in the interval $T_c$ comply simultaneously with Nyquist rate ($F_s \geq 2W$) and Equation (56). Otherwise, the samples $$S(k) |_{k=0}^{N-1}$$

provide an approximate representation of the signal.

As a nonlimiting example, one can consider a stationary zero-mean Gaussian source with sample variance at and a power spectrum density (PSD) that follows a raised cosine shape with rolloff factor $\alpha=1$, center frequency $F_c=7$ GHz and bandwidth 4 GHz as shown in FIG. 6A. The signal is segmented in intervals of $T_c=3$ ns to be A/D converted, thus indicating a frequency space between samples of $\Delta F=333.33$ MHz. The bit rates can be distributed among the coefficients, leading to the set of curves of MSE distortion versus average bit rate R plotted in FIG. 6B. The MSE distortion for PCM is also shown for comparison purposes. The orthogonal space A/D conversion gain ($G_{OSADC}$) is plotted in FIG. 6C against the number of coefficients N for several values of average bit rates R. These drawings show the potential gain of performing the A/D conversion in the frequency domain together with optimal bit allocation, especially when the target average bit rate is low. For this example, a gain of up to 54.7 (5.2 dB) can be achieved when N=17 coefficients can be implemented. Notice that although the MSE distortion is in general valid for large bit rates, for Gaussian sources the expression holds even for small rates, so the curves in FIGS. 6A-6C are generally exact.

A/D conversion in orthogonal spaces can be utilized in numerous applications including communications and signal processing problems such as signal modulation, matched filtering and space-time array processing. As a nonlimiting example, the matched filtering problem can be carried out in the frequency domain thanks to the time-frequency duality provided by Fourier analysis.

One can assume that the frequency domain ADC provides a set of full resolution coefficients $S_m=[S_m(0), \ldots, S_m(K-1)]$ every $T_c$ seconds, where $m=0 \ldots, M-1$ and the information symbol period T is related with the A/D conversion period as $T=MT_c$. One can begin with expressing the calculation of the matched filter output $\hat{m}$ in the time domain $$\hat{m} \int_0^T s(\tau)h(T-\tau)d\tau, \tag{A58}$$

where h(t) is the impulse response of the matched filter and the output of this filter is sampled at t=T. To reflect the effect of segmenting the information symbol time $T_s$ into M time-slots of duration $T_c$, one can define the following signals $$s_m(t) = s(t + mT_c), \quad 0 \leq t \leq T_c \tag{A59}$$
$$h_m(T-t) = h(T-(t+mT_c)), \quad 0 \leq t \leq T_c,$$

where $m=0, \ldots, M-1$, and the signals $s_m(t)$ and $h_m(t)$ are equal to zero outside the interval $0 \leq t \leq T_c$. Using these definitions, the matched filter output in Equation (A58) can be expressed as $$\hat{m} = \sum_{m=0}^{M-1} \int_{mT_c}^{(m+1)T_c} s(\tau)h(T-\tau)d\tau \tag{A60}$$
$$= \sum_{m=0}^{M-1} \int_0^{T_c} s_m(\tau)h_m(T-\tau)d\tau,$$

in which the integral in Equation (A58) has been segmented into M pieces of duration $T_c$ each, such that $T=MT_c$.

In order to express the matched filter operations in the frequency-domain, the Fourier transform is applied to Equation (A60), which can result in $$\hat{m} = \mathcal{F}\left\{\sum_{m=0}^{M-1} \int_0^{T_c} s_m(\tau)h_m(T-\tau)d\tau,\right\} \tag{A61}$$
$$= \sum_{m=0}^{M-1} \mathcal{F}\left\{\int_0^{T_c} s_m(\tau)h_m(T-\tau)d\tau\right\}$$
$$= \sum_{m=0}^{M-1} \int_{-\infty}^{\infty} S_m(F)H_m^*(F)dF,$$

where $S_m(F)=\mathcal{F}\{s_m(t)\}$ and $H_m(F)=\mathcal{F}\{h_m(T-t)\}$ the second line in Equation (A61) follows from the linearity property of the Fourier transform and the third line follows from Parseval's theorem. So, the exact calculation of the matched filter output in the frequency domain can require the Fourier transforms of all the segmented received signals, namely $$S_m(F)|_{m=0}^{M-1},$$

and the Fourier transform of the segmented matched filters, $$H_m(F)|_{m=0}^{M-1}.$$

However, since K samples of the signal spectrum are provided by the frequency ADC, (A61) is can be approximated as $$\hat{m} = \sum_{m=0}^{M-1} \int_{-\infty}^{\infty} S_m(F) H_m^*(F) \, dF \quad \text{(A62)}$$

$$\approx \sum_{m=0}^{M-1} \frac{\Delta F}{F_s} \sum_{k=0}^{K-1} S_m(k) H_m^*(k)$$

$$= \frac{\Delta F}{F_s} \sum_{m=0}^{M-1} \sum_{k=0}^{K-1} S_m(k) H_m^*(k).$$

If the number of frequency samples K is chosen such that the discrete-time signals $s_m(n)=\text{IDFT}\{S_m(k)\}$ and $h_m(n)=\text{IDFT}\{H_m(k)\}$, where n, k=0, . . . , K−1, comply with both no discrete-time aliasing and Nyquist rate, the error introduced in Equation (18) is negligible.

Expressing a signal as in Equation. (A1), where the coefficients $$|_{l=0}^{N-1}$$

are information symbols to be transmitted through a communications channel, opens a general technique to transmit information using orthogonal signals. A nonlimiting example of multi-orthogonal transmissions is the multi-carrier transmission technique where the orthogonal functions are the complex exponentials $$s(t) = \sum_{l=0}^{N-1} a_l e^{j2\pi f_l t}, \quad 0 \le t \le T. \quad \text{(A63)}$$

As a nonlimiting example, embodiments of this disclosure can include multi-carrier modulation.

Figure 7A:
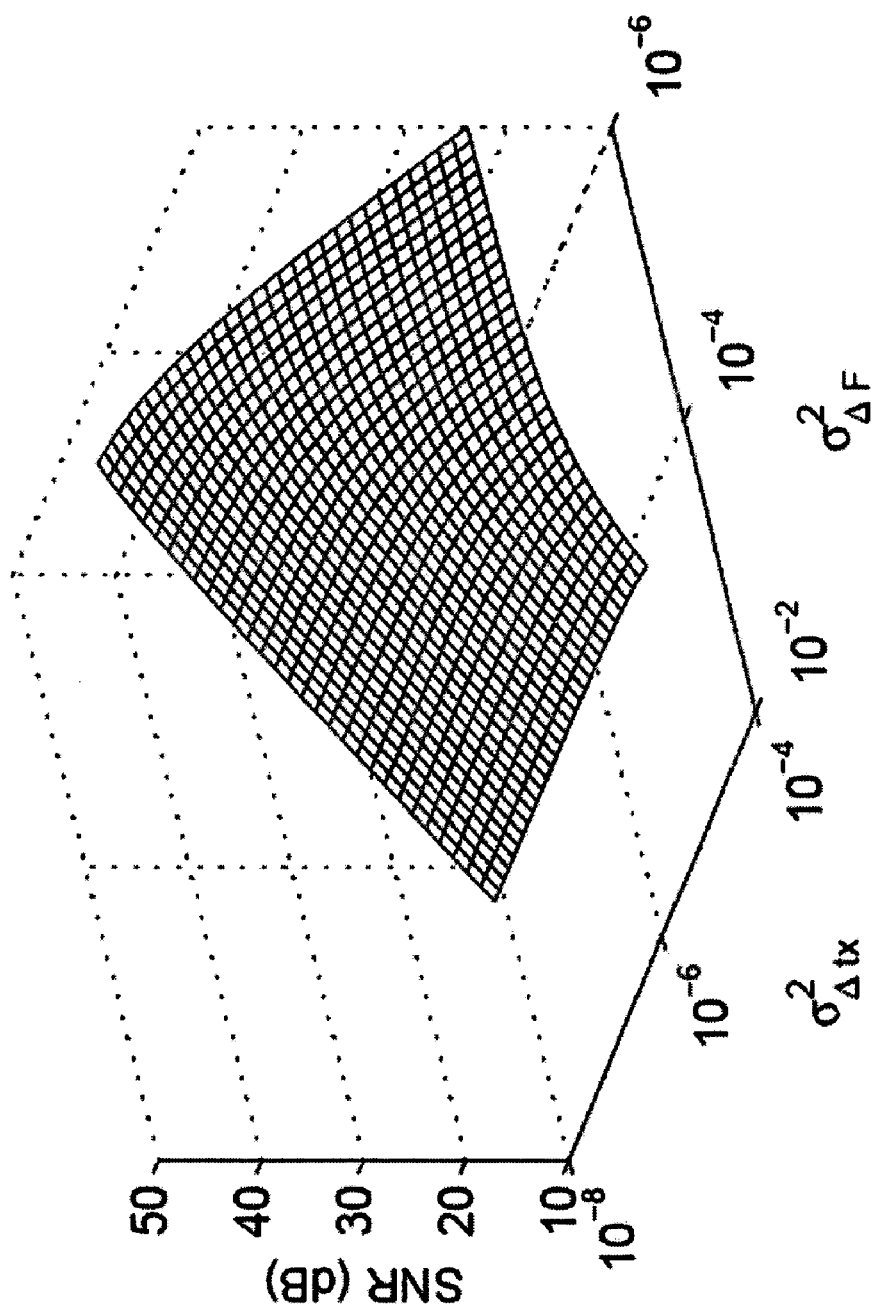
FIG. 7A is an exemplary signal to noise and distortion ratio for a frequency domain analog to digital converter, such as the analog to digital converter from FIG. 4.

FIG. 7A is an exemplary signal to noise and distortion ratio for a frequency domain analog to digital converter, such as the analog to digital converter from FIG. 4. More specifically, FIG. 7A illustrates the impact of the implementation impairments on the SNDR. Each plot shows the impact of two impairments on the SNDR; the left column shows the 3-dimensional plots and the right column shows the corresponding isolines. The number of frequency samples is N=5.

Figure 7B:
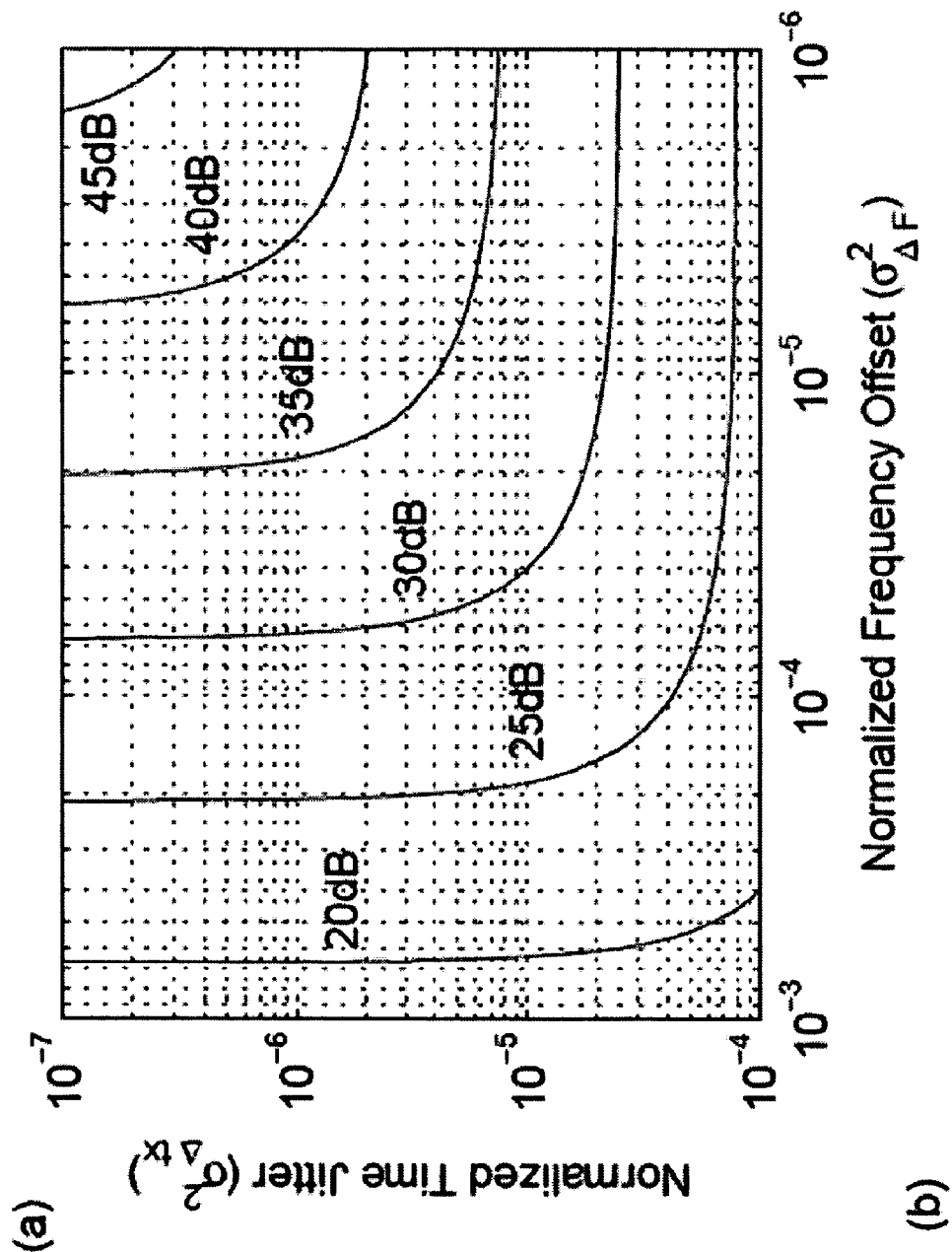
FIG. 7B is an exemplary two-dimensional representation of the graph from FIG. 7A.

FIG. 7B is an exemplary two-dimensional representation of the graph from FIG. 7A. More specifically, FIG. 7B illustrates normalized time jitter versus normalized frequency offset.

Figure 8A:
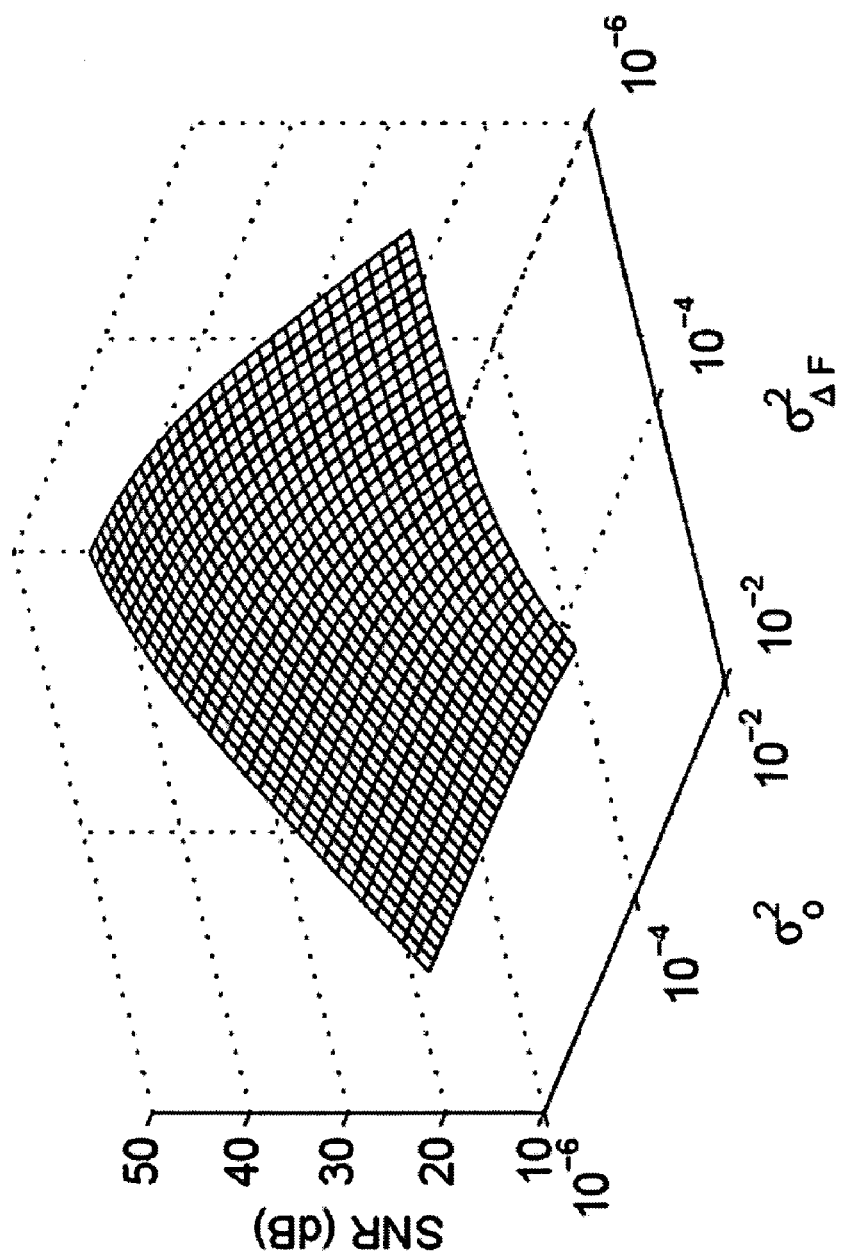
FIG. 8A is an additional exemplary signal to noise and distortion ratio for a frequency domain analog to digital converter, such as the analog to digital converter from FIG. 4.

FIG. 8A is an additional exemplary signal to noise and distortion ratio for a frequency domain analog to digital converter, such as the analog to digital converter from FIG. 4. More specifically, FIG. 8A illustrates a graph of SNR versus additive noise and normalized frequency offset.

Figure 8B:
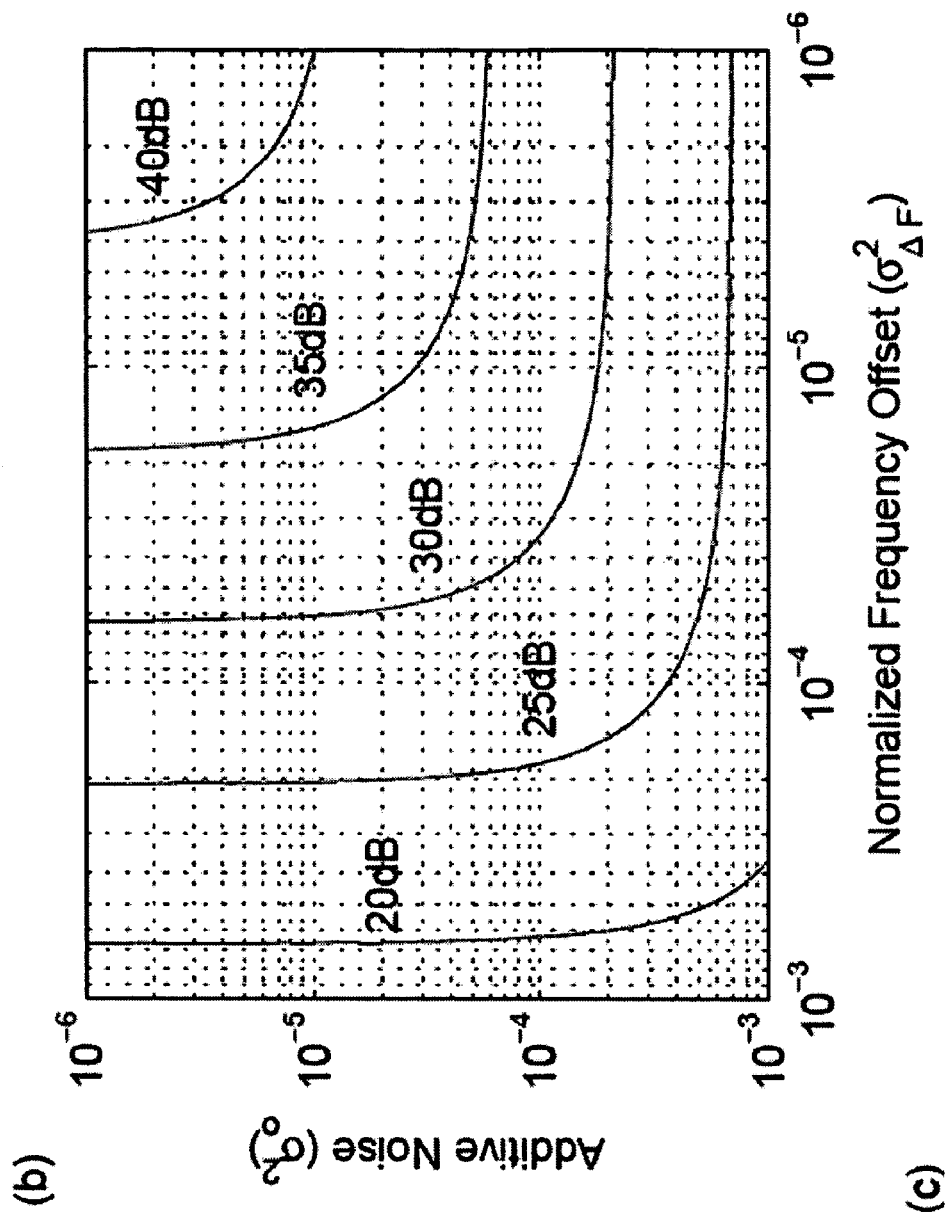
FIG. 8B is an exemplary two-dimensional representation of the graph from FIG. 8A.

FIG. 8B is an exemplary two-dimensional representation of the graph from FIG. 8A. More specifically, FIG. 8B illustrates additive noise versus normalized frequency offset.

Figure 9A:
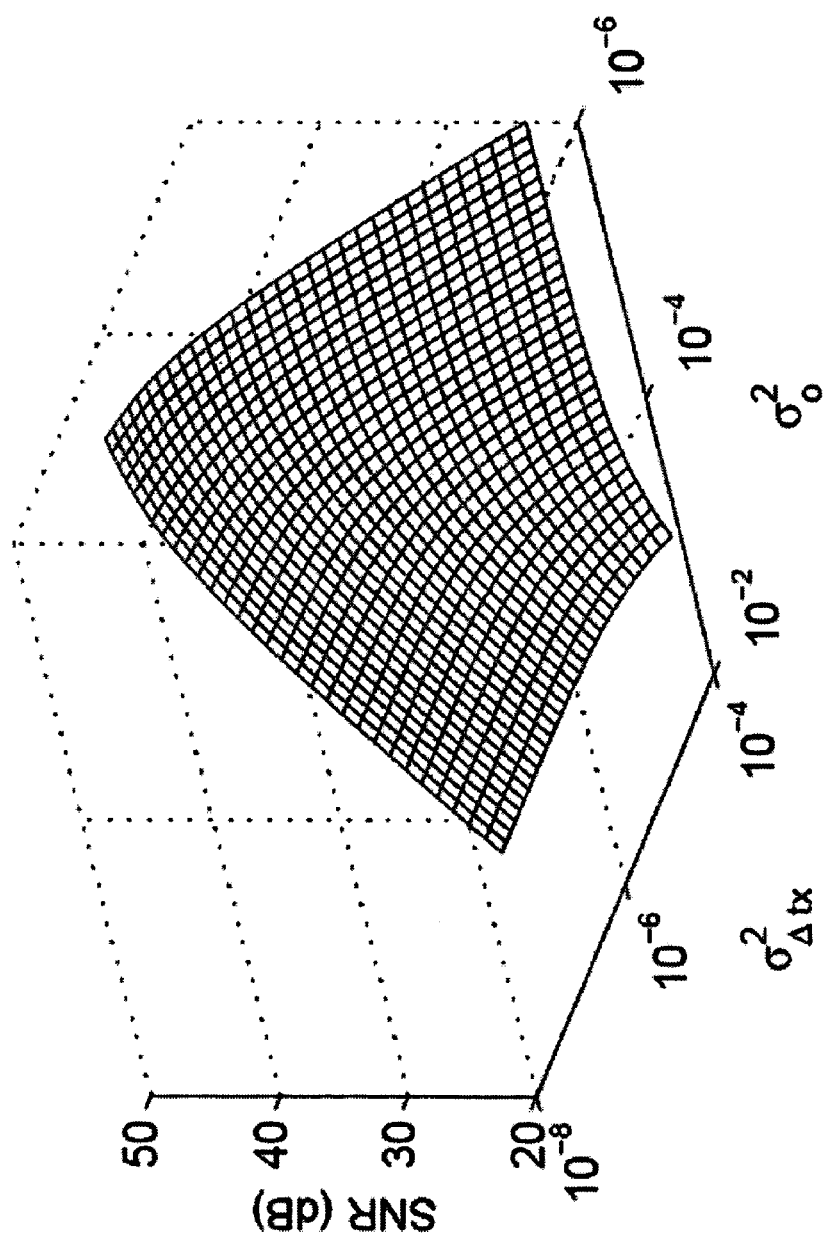
FIG. 9A is yet another exemplary signal to noise and distortion ratio for a frequency domain analog to digital converter, such as the analog to digital converter from FIG. 4.

FIG. 9A is yet another exemplary signal to noise and distortion ratio for a frequency domain analog to digital converter, such as the analog to digital converter from FIG. 4. More specifically FIG. 9A illustrates SNR versus normalized time jitter and additive noise.

Figure 9B:
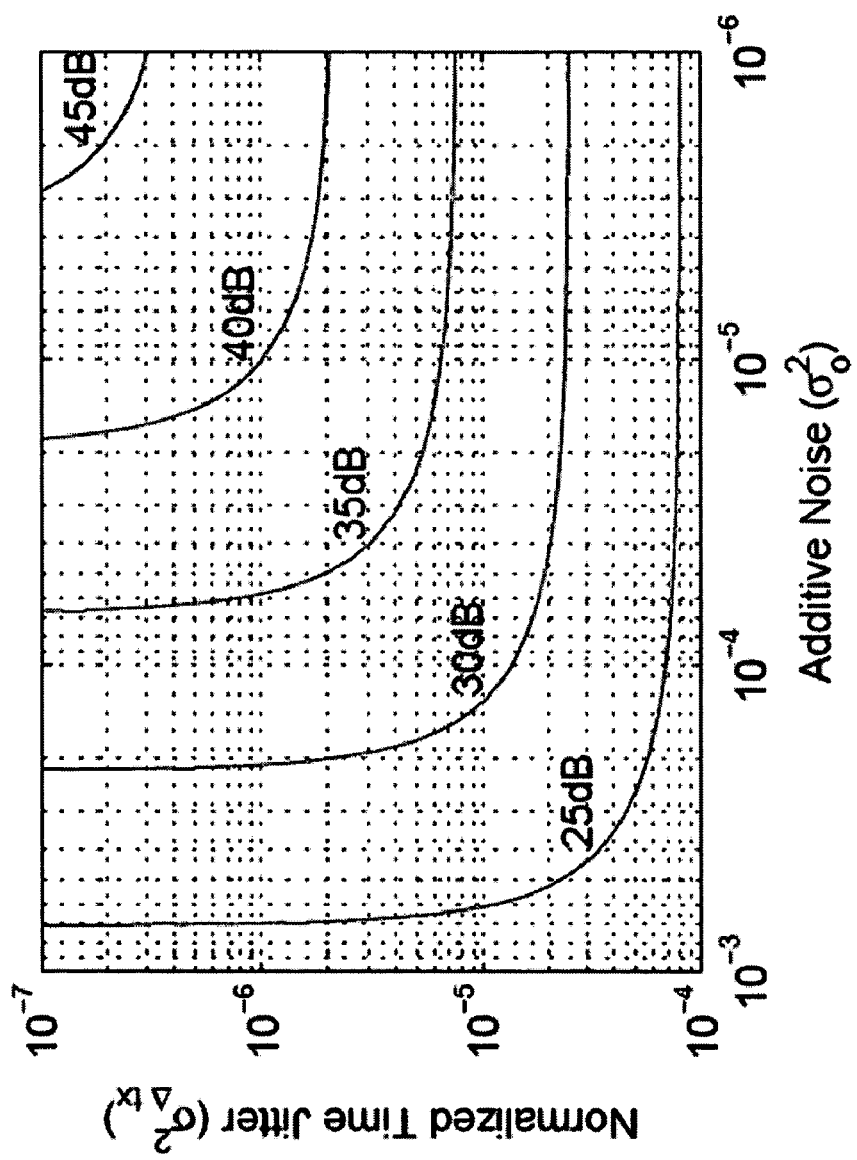
FIG. 9B is an exemplary two-dimensional representation of the graph from FIG. 9A.

FIG. 9B is an exemplary two-dimensional representation of the graph from FIG. 9A. More specifically, FIG. 9A illustrates normalized time jitter versus additive noise.

To understand the implication of the results presented in FIGS. 7A through 9B, one can consider a practical SNDR test scenario. One can assume that a $F_x=5$ GHz tone drives the frequency ADC. The sampling period $T_c$ is chosen to be five periods of the sinusoidal signal, $T_c=1$ ns, which leads to a frequency spacing between samples of $\Delta F_c=1$ GHz. Additionally, the DC has N=5 branches which implies that 5 samples of the spectrum are taken for each $T_c$ sec window. Thus, the 5 samples are uniformly distributed around the tone frequency leading to the frequency range 3-7 (inclusive) GHz. If the frequency samples do not suffer from frequency offset, only the sample at $F_x=5$ can be nonzero as the other samples will lie at the nulls of the spectrum of the input signal. However, frequency offset can result in the components collecting some undesired energy, degrading the SNDR as defined in Equation (A47). To obtain a sense of practical levels of frequency offset and timing errors that can be tolerated in this specific example, assuming that from FIGS. 7A through 9B one can conclude that acceptable SNDR value is around 40 dB. This is achieved with a normalized frequency offset second moment $$\sigma_{\Delta F}^2$$

near $10^{-6}$ GHz$^2$ together with a normalized time error with second moment around $10^{-6}$ s$^2$. Then, the second order moment of the frequency offset can be equal to $$E\{\Delta F_n^2\} = \Delta F_c^2 \sigma_{\Delta F}^2 = 10^{18} 10^{-6} = 10^{12} \text{ GHz}^2.$$

Now, assuming a deterministic frequency offset, a second order moment of $10^{12}$ GHz$^2$ can be achieved by a fixed offset of 1 MHz or less. So, for the highest oscillator frequency, i.e., the one at 10 GHz, a requirement of only 103 parts per million (ppm) is desired.

In the case of timing errors, the target SNDR can be achieved with normalized second moment of around $10^{-6}$, which leads to an absolute time error second moment of $$E\{\Delta t_n^2\} = \frac{\sigma_{\Delta t_n}^2}{F_x^2} = \frac{10^{-6}}{25*10^{18}} = 4*10^{-26} \text{ s}^2.$$

Once again assuming a fixed time offset, a second order moment of $4 \times 10^{26}$ s is achieved with a time offset of 0.2 picoseconds (ps). Thus, up to 0.2 ps of time offset are allowed in time windows of 1 nanosecond (ns) for the specific example considered here. Lastly, an acceptable value of AWGN noise is around $10^{-6}$ W/Hz.

FIG.

Figure 10:
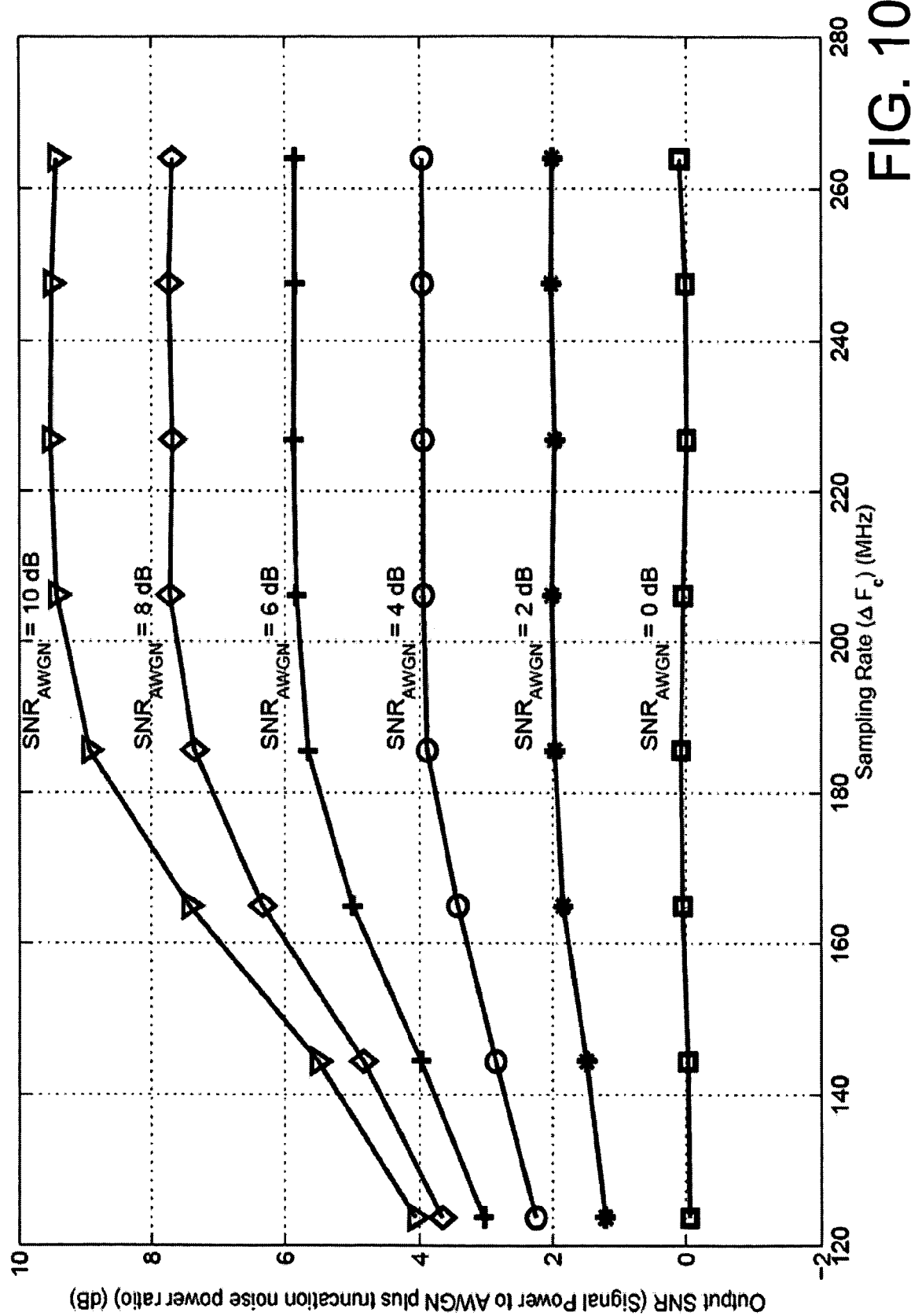
FIG. 10 is an exemplary output signal to noise ratio of a mixed-signal multi carrier receiver, such as the analog to digital converter from FIG. 4.

FIG. 10 is an exemplary output signal to noise ration of a mixed-signal multi carrier receiver, such as the analog to digital converter from FIG. 4. More specifically, FIG. 10 illustrates SNR versus sampling rate for different values of $SNR_{AWGN}=10 \log_{10}(E_b/N_o)$.

This disclosure explores analog to digital conversion of signal expansions, where an input analog signal is projected over a set of basis functions before quantization takes place. Quantization can be carried out over the coefficients obtained from this projection. This A/D conversion technique provides a potential gain over time-domain ADCs when optimal bit allocation is used in the quantization process of the coefficients. Additionally, a reduction of the sampling rate is achieved as the A/D conversion is performed at the end of a properly chosen time window of $T_c$ seconds during which the signal is projected. The sampling rate reduction can be associated with an increase in the number of basis functions on which the continuos-time signal is projected, leading to a fundamental trade-off between complexity and sampling rate. Further, this technique possesses some degree of flexibility in the design as trading between speed and distortion can be achieved by properly choosing the conversion time $T_c$ and the number of coefficients N.

This disclosure also establishes a framework for a family of mixed-signal communications receivers as a potential application of the ADC framework discussed herein, and closed-form expressions for symbol detection have been found. Embodiments of the receiver disclosed in architecture provides a means to implement wide-band communication receivers with parallel processing at lower sampling speeds, without time-domain signal reconstruction.

As a nonlimiting example, the frequency domain can constitute an appealing domain to perform the A/D conversion of signals that are wideband, such as ultra-wideband signals. Moreover, having samples of the signal spectrum can encourage implementing many communications and signal processing applications in the frequency domain. More specifically, one can show how the matched filter can be implemented, even though segmentation of the time-domain signal is used to reduce the number of coefficients. Additional robustness is obtained by the ADC in the frequency domain as it naturally filters narrow-band interference that lies away from the spectrum points where samples are taken. As a nonlimiting example, in communication systems using multi-carrier transmission, at least one embodiment of the A/D conversion in the frequency domain goes together with a very simple frequency domain implementation of the digital correlators needed for the estimation of the information symbols. Although the frequency domain is perhaps the oldest and best understood domain besides the time-domain, other domains may have desirable characteristics when carrying out A/D conversion. As a nonlimiting example, from a circuit implementation point of view, generation of the sinusoidal signals operating at frequencies $$F_l \mid_{l=0}^{N-1}$$

used for the projection of the input signal in the frequency domain ADC might lead to higher levels of complexity and power consumption. Lower complexity can be achieved by generating binary waveforms instead of sinusoidal ones. Transformations that use orthogonal signals with binary waveforms include the Hadamard transform, Walsh and Walsh-Fourier transform, and the Haar wavelet transform.

Digital systems that interface with real-world signals, such as voice, audio, communication waveforms, array processing etc. can be implemented with the A/D conversion ideas discussed herein. The solutions provided herein are especially beneficial for wideband systems and ultra-wideband systems, such as communications and geolocation.

Given a desired average number of bits B, one can allocate a total number of bits NB among the N coefficients, so that the error in Equation (A24) is minimized. The Lagrange multiplier method provides a solution to this constrained optimization problem as $$J(b_l \mid_{l=0}^{N-1}) = \sum_{l=0}^{N-1} \epsilon_l^2 \sigma_l^2 2^{-2b_l} + \lambda \left( \sum_{l=0}^{N-1} b_l - BN \right), \quad (A64)$$

where $\lambda$ must be chosen to satisfy $$\sum_{l=0}^{N-1} b_l - BN. \quad (A65)$$

Now, setting to zero the derivative of Equation (A64) with respect to $b_l$ leads to $$\frac{\partial J}{\partial b_l} = -(2\ln 2)\epsilon_l^2 \sigma_l^2 2^{-2b_l} = -\lambda. \quad (A66)$$

$\lambda$ is determined by the taking the product of Equation (A66) for all l, leading to $$\lambda^N = (2\ln 2)^N \left( \prod_{l=0}^{N-1} \epsilon_l^2 \sigma_l^2 \right) 2^{-2\sum_l b_l} = (2\ln 2)^N \left( \prod_{l=0}^{N-1} \epsilon_l^2 \sigma_l^2 \right) 2^{-2NB}, \quad (A67)$$

so that $$\lambda = (2\ln 2) \left( \prod_{l=0}^{N-1} \epsilon_l^2 \sigma_l^2 \right)^{1/N} 2^{-2B} \quad (A68)$$

After substitution in (A66), the optimum bit allocation is found to be $$b_l = B + \frac{1}{2} \log_2 \frac{\epsilon_l^2 \sigma_l^2}{\left( \prod_{l=0}^{N-1} \epsilon_l^2 \sigma_l^2 \right)^{1/N}}. \quad (A69)$$

For simplicity of the analysis one can assume that the impairments $\Delta F_n$, $\Delta t_n$, and On have equal variance in all the paths, i.e., $$\sigma_g^2 = E\{g_n^2\} \mid_{n=0}^{N-1}, \sigma_{\Delta F}^2 = \frac{E\{\Delta F_o^2\}}{\Delta F_o^2} \mid_{n=0}^{N-1},$$

$$\sigma_{\Delta t_n}^2 = F_x^2 E\{\Delta t_n^2\} \mid_{n=0}^{N-1}, \text{ and } \sigma_o^2 = E\{o_n^2\} \mid_{n=0}^{N-1}$$

One should also note that the parameters $$\sigma_{\Delta F}^2$$

and $$\sigma_{\Delta t_n}^2$$

are normalized with the factors $$\frac{1}{\Delta F_c^2}$$

and $$F_x^2,$$

respectively. The SNDR can be given by $$SNDR = 10\log_{10}\left(\frac{E\{|\text{Re}\{\bar{R}(F_x)\}|^2\}}{\sum_{\substack{n=0 \\ n \neq x}}^{N-1} E\{|\bar{R}(F_n)|^2\} + E\{|\text{Im}(\bar{R}(F_x))|^2\}}\right). \quad (A70)$$

The exact calculation of the expected values involved in Equation (A70) can be difficult. A simpler and perhaps more meaningful solution is provided by using truncated Taylor expansions. The following Taylor expansions can be used $$\left(\frac{\sin(x)}{x}\right)^2 \approx 1 - \frac{x^2}{3} \text{ expansion around } x = 0 \quad (A71)$$

$$\cos^2(x) \approx 1 - x^2 \text{ expansion around } x = 0 \quad (A72)$$

$$\sin^2(x) \approx x^2 \text{ expansion around } x = 0. \quad (A73)$$

The signal power term can be given by $$E\{|\text{Re}\{\bar{R}(F_x)\}|^2\} = E\left\{A^2 g_x^2\left(\frac{\sin(\pi T_c(\Delta F_x))}{\pi T_c(\Delta F_x)}\right)^2 \cos^2(2\pi F_x \Delta t_x) + o_{xR}^2\right\} \quad (A74)$$

$$\approx A^2 \sigma_g^2 \left(1 - \frac{\pi^2}{3}\sigma_{\Delta F}^2\right)(1 - 4\pi^2 \sigma_{\Delta t_x}^2) + \frac{1}{2}\sigma_o^2$$

The noise terms in the sum of the denominator of Equation (A70) are approximated as $$E\{|\bar{R}(F_n)|^2\} = E\left\{A^2 g_n^2\left(\frac{\sin(\pi T_c(F_n + \Delta F_n - F_x))}{\pi T_c(F_n + \Delta F_n - F_x)}\right)^2 o_n^2\right\} \quad (A75)$$

$$\approx A^2 \sigma_{\Delta F}^2 \sigma_g^2 (n-x)^{-2} + \sigma_o^2, n \neq x$$

The noise term due to the imaginary part of $\bar{R}(F_x)$ is approximated as $$E\{|\text{Im}\{\bar{R}(F_x)\}|^2\} = E\left\{A^2 g_x^2\left(\frac{\sin(\pi T_c(\Delta F_x))}{\pi T_c(\Delta F_x)}\right)^2 \sin^2(2\pi F_x \Delta t_x) + o_{xI}^2\right\} \quad (A76)$$

$$\approx A^2 \sigma_g^2 \left(1 - \frac{\pi^2}{3}\sigma_{\Delta F}^2\right)(4\pi^2 \sigma_{\Delta t_x}^2) + \frac{1}{2}\sigma_o^2$$

These results lead to the following expression for the SNDR $$SNDR = \quad (A77)$$

-continued $$10\log_{10}\left(\frac{A^2 \sigma_g^2\left(1 - \frac{\pi^2}{3}\sigma_{\Delta F}^2\right)(1 - 4\pi^2 \sigma_{\Delta t_x}^2) + \frac{1}{2}\sigma_o^2}{A^2 \sigma_g^2\left(\sigma_{\Delta F}^2 \sum_{\substack{n=0 \\ n \neq x}}^{N-1}(n-x)^{-2} + \left(1 - \frac{\pi^2}{3}\sigma_{\Delta F}^2\right)(4\pi^2 \sigma_{\Delta t_x}^2)\right) + \left(N - \frac{1}{2}\right)\sigma_o^2}\right).$$

Figure 11:
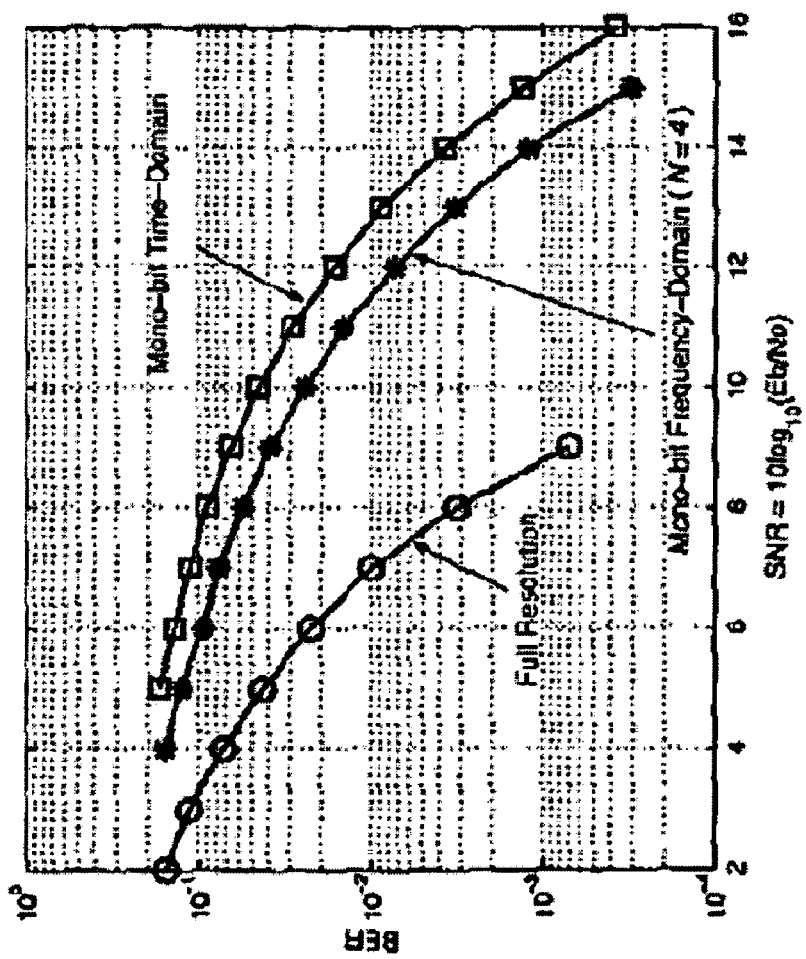
FIG. 11 is an exemplary graphical depiction of bit error rate curves for a transmitted reference receiver, such as shown in FIG. 4.

FIG. 11 is an exemplary graphical depiction of bit error rate (BER) curves for a transmitted reference receiver, similar to that shown in FIG. 4. More specifically, BER is plotted against SNR. A full resolution curve, a mono-bit frequency domain curve, and a mono-bit time domain curve is shown.

Generally, in terms of hardware architecture, embodiments of a device that can perform functions described herein can include a processor, volatile and nonvolatile memory, and one or more input and/or output (I/O) device interface(s) that are communicatively coupled via a local interface. The local interface can include, for example but not limited to, one or more buses or other wired or wireless connections. The local interface may have additional elements, which are omitted for simplicity, such as controllers, buffers (caches), drivers, repeaters, and receivers to enable communications. Further, the local interface may include address, control, and/or data connections to enable appropriate communications among the aforementioned components. The processor may be a hardware device for executing software, particularly software stored in volatile and nonvolatile memory.

The processor can be any custom made or commercially available processor, a central processing unit (CPU), an auxiliary processor among several processors associated with the device, a semiconductor based microprocessor (in the form of a microchip or chip set), a macroprocessor, or generally any device for executing software instructions. Examples of suitable commercially available microprocessors are as follows: a PA-RISC series microprocessor from Hewlett-Packard® Company, an 80x86 or Pentium® series microprocessor from Intel® Corporation, a PowerPC® microprocessor from IBM®, a Sparc® microprocessor from Sun Microsystems®, Inc, or a 68xxx series microprocessor from Motorola® Corporation.

The volatile and nonvolatile memory can include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory may incorporate electronic, magnetic, optical, and/or other types of storage media. Note that the volatile and nonvolatile memory can have a distributed architecture, where various components are situated remote from one another, but can be accessed by the processor. Additionally volatile and nonvolatile memory can include communications software and an operating system.

The software in volatile and nonvolatile memory may include one or more separate programs, each of which includes an ordered listing of executable instructions for implementing logical functions. Additionally, the software in the volatile and nonvolatile memory may include an operating system. A nonexhaustive list of examples of suitable commercially available operating systems is as follows: (a) a Windows® operating system available from Microsoft® Corporation; (b) a Netware® operating system available from Novell®, Inc.; (c) a Macintosh® operating system available from Apple® Computer, Inc.; (d) a UNIX operating system, which is available for purchase from many vendors, such as the Hewlett-Packard® Company, Sun Microsystems®, Inc., and AT&T® Corporation; (e) a LINUX operating system, which is freeware that is readily available on the Internet; (f) a run time Vxworks® operating system from WindRiver® Systems, Inc.; or (g) an appliance-based operating system, such as that implemented in hand-held computers or personal data assistants (PDAs) (e.g., PalmOS® available from Palm® Computing, Inc., and Windows CE® available from Microsoft® Corporation). The operating system essentially controls the execution of other computer programs and provides scheduling, input-output control, file and data management, memory management, and communication control and related services.

A system component embodied as software may also be construed as a source program, executable program (object code), script, or any other entity comprising a set of instructions to be performed. When constructed as a source program, the program is translated via a compiler, assembler, interpreter, or the like, which may or may not be included within the volatile and nonvolatile memory, so as to operate properly in connection with the Operating System.

The Input/Output devices that may be coupled to system I/O Interface(s) may include input devices, for example but not limited to, a keyboard, mouse, scanner, microphone, etc. Further, the Input/Output devices may also include output devices, for example but not limited to, a printer, display, speaker, etc. Finally, the Input/Output devices may further include devices that communicate both as inputs and outputs, for instance but not limited to, a modulator/demodulator (modem; for accessing another device, system, or network), a radio frequency (RF) or other transceiver, a telephonic interface, a bridge, a router, etc.

If the device is a personal computer, workstation, or the like, the software in the volatile and nonvolatile memory may further include a basic input output system (BIOS) (omitted for simplicity). The BIOS is a set of software routines that initialize and test hardware at startup, start the Operating System, and support the transfer of data among the hardware devices. The BIOS is stored in ROM so that the BIOS can be executed when the device is activated.

When the device is in operation, the processor can be configured to execute software stored within the volatile and nonvolatile memory, to communicate data to and from the volatile and nonvolatile memory and to generally control operations of the device pursuant to the software. Software in memory, in whole or in part, are read by the processor, perhaps buffered within the processor, and then executed.

One should note that the flowcharts included herein show the architecture, functionality, and operation of a possible implementation of software. In this regard, each block can be interpreted to represent a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

One should note that any of the programs listed herein, which can include an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium could include an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). In addition, the scope of the certain embodiments of this disclosure can include embodying the functionality described in logic embodied in hardware or software-configured mediums.

It should be emphasized that the above-described embodiments are merely possible examples of implementations, merely set forth for a clear understanding of the principles of this disclosure. Many variations and modifications may be made to the above-described embodiment(s) without departing substantially from the spirit and principles of the disclosure. All such modifications and variations are intended to be included herein within the scope of this disclosure.

The invention claimed is:

1. A method for converting a received analog signal into a digital signal, the method comprising:
  receiving an analog signal;
  periodically dividing the received analog signal into a plurality of discrete signals at a predetermined interval, wherein each of the plurality of divided signals is associated with a voltage; and
  quantizing the voltage associated with at least one of the plurality of divided signals using a vector quantizer with relaxed characteristics operating over a digital conversion level that can change with a speed lower than the Nyquist rate required for time domain analog to digital conversion.

2. The method of claim 1, wherein dividing the received analog signal includes a frequency domain basis expansion and wherein the plurality of discrete signals are taken at a rate that guarantees no aliasing in a discrete version of the signal.

3. The method of claim 1, wherein dividing the received analog signal includes subjecting at least one of the plurality of divided signals to at least one exponential.

4. The method of claim 1, further comprising introducing a frequency offset.

5. The method of claim 1, wherein dividing the received analog signal includes subjecting at least one of the plurality of divided analog signals to an integral function.

6. The method of claim 1, further comprising filtering the received analog signal.

7. The method of claim 1, wherein dividing the received analog signal includes dividing using a plurality of orthogonal basis functions.

8. A system for converting a received analog signal to a digital signal, the system comprising:

at least one receiving component configured to receive an analog signal;

at least one dividing component configured to periodically divide the received analog signal into a plurality of discrete signals at a predetermined interval, wherein each of the plurality of divided signals is associated with a voltage; and at least one quantizer configured to quantize the voltage associated with at least one of the plurality of divided signals using a vector quantizer with relaxed characteristics operating over a digital conversion level that can change with a speed lower than the Nyquist rate required for time domain analog to digital conversion.

9. The analog to digital converter of claim 8, wherein the means for dividing the received analog signal includes means for providing a frequency domain basis and wherein the plurality of discrete signals are taken at a rate that guarantees no aliasing in a discrete version of the signal.

10. The analog to digital converter of claim 8, wherein the dividing component includes means for subjecting at least one of the plurality of divided signals to at least one exponential.

11. The analog to digital converter of claim 8, further comprising means for introducing a frequency offset.

12. The analog to digital converter of claim 8, wherein dividing component includes means for subjecting at least one of the plurality of divided analog signals to an integral function.

13. The analog to digital converter of claim 8, further comprising at least one filter for filtering the received analog signal.

14. The analog to digital converter of claim 8, wherein the dividing component includes means for dividing using a plurality of orthogonal basis functions.

15. A method for converting a received analog signal into a digital signal, the method comprising:

receiving an analog signal;

projecting the received analog signal over basis functions yielding parallel data streams;

sampling a plurality of basis coefficients;

calculating N basis coefficients in parallel analog computations every $T_c$ seconds followed by N parallel analog to digital converters each of which runs at a speed inversely proportional to a time-window of $T_c$ seconds duration, introducing a trade-off between sampling speed reduction and system complexity;

associating each of the N basis coefficients with a voltage; and quantizing the voltage associated with at least one of the plurality of basis coefficients at the end of the time window $T_c$ using a vector quantizer with relaxed characteristics operating over a digital conversion level that can change with a speed lower than that required for time domain analog to digital conversion.

16. The method of claim 15 wherein potential lower bit requirements can be achieved by optimally allocating a total finite number of bits used in the quantification of the coefficients obtained through the projection of the continuous-time signal over the basis set in terms of number of bits per sample.

17. The method of claim 15 wherein a distortion introduced by the analog to digital converter generated by a potential limited number of coefficients N and by a total finite number of bits used in the quantization of the coefficients reaches a zero value for a number of coefficients N*.

18. The method of claim 15 wherein an optimal bit allocation per coefficient among N coefficients is achieved when an output of the analog to digital converter is a constant B.

19. The method of claim 15 wherein the number of basis coefficients is reduced while keeping a level of distortion that is equal to a level of distortion obtained in a time-domain analog to digital conversion with pulse code modulation.

20. The method of claim 15 wherein distortion gain is traded for a reduction in number of parallel analog to digital converters, so that the number of basis coefficients required is calculated from a selected acceptable gain and the desired number of total finite bits.

* * * * *